United States Patent
Nakagawa

(10) Patent No.: US 11,605,359 B2
(45) Date of Patent: Mar. 14, 2023

(54) DISPLAY APPARATUS AND DISPLAY PANEL

(71) Applicant: Sharp Display Technology Corporation, Kameyama (JP)

(72) Inventor: Hidetoshi Nakagawa, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 17/849,519

(22) Filed: Jun. 24, 2022

(65) Prior Publication Data

US 2023/0036306 A1    Feb. 2, 2023

Related U.S. Application Data

(60) Provisional application No. 63/227,702, filed on Jul. 30, 2021.

(51) Int. Cl.
*G09G 3/36* (2006.01)
*G02F 1/1362* (2006.01)
*G11C 19/28* (2006.01)

(52) U.S. Cl.
CPC ..... *G09G 3/3648* (2013.01); *G02F 1/136286* (2013.01); *G09G 2300/0408* (2013.01); *G09G 2300/0426* (2013.01); *G09G 2310/0286* (2013.01); *G11C 19/28* (2013.01)

(58) Field of Classification Search
CPC ............. G09G 3/3648; G09G 3/3655; G02F 1/136286; G11C 19/28
See application file for complete search history.

(56) References Cited

U.S. PATENT DOCUMENTS

| | | | |
|---|---|---|---|
| 2012/0168762 A1* | 7/2012 | Kikuchi | G02F 1/13458 257/E29.273 |
| 2012/0235983 A1 | 9/2012 | Sakamoto et al. | |
| 2021/0065642 A1* | 3/2021 | Shin | G09G 3/3674 |
| 2022/0172692 A1* | 6/2022 | Wang | G02F 1/134345 |

FOREIGN PATENT DOCUMENTS

WO    2011/065045 A1    6/2011

* cited by examiner

*Primary Examiner* — Sanghyuk Park
(74) *Attorney, Agent, or Firm* — ScienBiziP, P.C.

(57) ABSTRACT

A display apparatus includes: a display panel including a display region, a first peripheral region, and a second peripheral region; and a circuit substrate. The display panel includes a gate drive circuit, n number of clock main lines, an outer main line and an inner main line, and a plurality of branch wiring lines. The first peripheral region includes a plurality of unit regions. The plurality of unit regions includes a first unit region and a second unit region. A resistance value of the at least one branch wiring line between the inner main line and the outer main line in the first unit region is smaller than a resistance value of the at least one branch wiring line between the inner main line and the outer main line in the second unit region.

19 Claims, 31 Drawing Sheets

DISPLAY APPARATUS AND DISPLAY PANEL

CROSS-REFERENCE TO RELATED APPLICATION

The present application claims priority from Provisional Application 63/227,702, the content to which is hereby incorporated by reference into this application.

BACKGROUND OF THE INVENTION

1. Field of the Invention

The disclosure relates to a display apparatus and a display panel, and for example, relates to a liquid crystal display device and a liquid crystal display panel.

2. Description of the Related Art

Liquid crystal display devices are used in various applications such as mobile terminals, televisions, and the like. The frame narrowing of the liquid crystal display devices is required from the perspective of reducing manufacturing costs, and the perspective of designability and functionality. Using a gate driver monolithic (GDM) technology in which a gate drive circuit (referred to as a "gate driver" in some cases) is integrally formed on a TFT substrate can reduce the costs related to driver implementation and improve the frame narrowing as compared to a case where a gate drive circuit is mounted on a TFT substrate by using a chip on film (COF), a chip on glass (COG), or the like. The GDM technology is sometimes referred to as a gate on array (GOA).

WO 2011/065045 discloses a liquid crystal display device to which a GDM technology is applied. The liquid crystal display device disclosed in WO 2011/065045 is provided with a gate drive circuit, and a group of main lines extending in a vertical direction, the group of main lines being configured to supply a signal to the gate drive circuit in a region on a TFT substrate corresponding to a region (referred to as a "peripheral region" or "frame region" in some cases) other than a display region of the liquid crystal display device, such as a left side portion and/or a right side portion of the TFT substrate.

SUMMARY

Technical Problem

According to the study of the present inventor, in the liquid crystal display device disclosed in WO 2011/065045, the peripheral region provided with the gate drive circuit and the group of the main lines configured to supply a signal to the gate drive circuit may generate excessive heat. Details will be described below. Note that the above-described problem that the peripheral region generates excessive heat is not limited to the liquid crystal display device, and may occur, for example, in an organic EL display apparatus. Further, the above-described problem that the peripheral region generates excessive heat is likely to occur in the display apparatus to which the GDM technology is applied, but the problem is not limited to the display apparatus to which the GDM technology is applied.

The disclosure has been made to solve the above-described problem, and an object of the disclosure is to provide a display apparatus that suppresses generation of heat in a peripheral region and a display panel to be used in such a display apparatus.

Solution to Problem

According to the embodiments of the disclosure, there are provided solutions according to the following items.
Item 1
A display apparatus including a plurality of pixels arrayed in a matrix including a plurality of pixel rows and a plurality of pixel columns, the display apparatus including
a display panel including a display region defined by the plurality of pixels, a first peripheral region adjacent to the display region in a row direction, and a second peripheral region adjacent to the display region in a column direction, and
a circuit substrate connected to a terminal portion provided in the second peripheral region of the display panel,
wherein the display panel includes
a gate drive circuit provided in the first peripheral region, the gate drive circuit including a shift register, the shift register including a plurality of stages individually corresponding to the plurality of pixel rows,
n number of clock main lines provided in the first peripheral region, where n is an integer being equal to or larger than 2, each of the n number of clock main lines extending in the column direction, the n number of clock main lines being configured to supply n number of types of clock signals having different phases from one another to the plurality of stages included in the shift register,
an outer main line and an inner main line provided in the first peripheral region, each of the outer main line and the inner main line extending in the column direction, and the outer main line and the inner main line being configured to supply a common signal to the plurality of stages included in the shift register, and
a plurality of branch wiring lines provided in the first peripheral region, each of the plurality of branch wiring lines electrically connecting the outer main line and the inner main line,
the circuit substrate includes a control circuit configured to supply a control signal to the gate drive circuit,
the first peripheral region includes a plurality of unit regions arrayed in the column direction, the plurality of unit regions individually corresponding to the n number of stages included in the shift register, the n number of stages being configured to be supplied with the n number of types of clock signals having the different phases from one another from the n number of clock main lines,
the plurality of branch wiring lines include at least one branch wiring line for each unit region, and
the plurality of unit regions include a first unit region and a second unit region, the first unit region being disposed closer to the terminal portion than the second unit region, a resistance value of the at least one branch wiring line between the inner main line and the outer main line in the first unit region being smaller than a resistance value of the at least one branch wiring line between the inner main line and the outer main line in the second unit region.
Item 2
The display apparatus according to item 1, wherein a total area of the at least one branch wiring line in the first unit region is larger than a total area of the at least one branch wiring line in the second unit region.

Item 3
  The display apparatus according to item 1 or 2,
  wherein the number of the branch wiring lines being the at least one branch wiring line in the first unit region is larger than the number of the branch wiring lines being the at least one branch wiring line in the second unit region.

Item 4
  The display apparatus according to any one of items 1 to 3,
  wherein the plurality of branch wiring lines include a first branch wiring line provided in the first unit region, the first branch wiring line extending in the row direction, and a second branch wiring line provided in the second unit region, the second branch wiring line extending in the row direction, and the first branch wiring line is larger in width in the column direction than the second branch wiring line.

Item 5
  The display apparatus according to any one of items 1 to 4, further including
  a first conductive layer including the outer main line and the inner main line,
  a second conductive layer including the plurality of branch wiring lines, and
  an insulating layer provided between the first conductive layer and the second conductive layer,
  wherein the insulating layer includes
  a plurality of first contact holes each connecting a corresponding one of the plurality of branch wiring lines and the outer main line, and
  a plurality of second contact holes each connecting a corresponding one of the plurality of branch wiring lines and the inner main line, and
  an overlapping area of the at least one branch wiring line and the outer main line in a corresponding one of the plurality of first contact holes, in the first unit region is larger than an overlapping area of the at least one branch wiring line and the outer main line in the corresponding one of the plurality of first contact holes, in the second unit region.

Item 6
  The display apparatus according to item 5,
  wherein an overlapping area of the at least one branch wiring line and the inner main line in the corresponding one of the plurality of second contact holes, in the first unit region is larger than an overlapping area of the at least one branch wiring line and the inner main line in the corresponding one of the plurality of second contact holes, in the second unit region.

Item 7
  The display apparatus according to any one of items 1 to 6,
  wherein the plurality of branch wiring lines include
  a branch wiring line extending in the row direction, the branch wiring line being provided in the first unit region,
  an adjacent branch wiring line extending in the row direction, the adjacent branch wiring line being provided in a unit region adjacent to the first unit region in the column direction, of the plurality of unit regions, and
  a contact branch wiring line extending in the column direction, the contact branch wiring line electrically connecting the branch wiring line and the adjacent branch wiring line.

Item 8
  The display apparatus according to any one of items 1 to 7,
  wherein the plurality of branch wiring lines include
  two branch wiring lines extending in the row direction, the two branch wiring lines being provided in the first unit region, and
  a contact branch wiring line extending in the column direction, the contact branch wiring line being provided in the first unit region, the contact branch wiring line electrically connecting the two branch wiring lines to each other.

Item 9
  The display apparatus according to any one of items 1 to 8,
  wherein the outer main line and the inner main line are disposed farther from the display region than the shift register.

Item 10
  The display apparatus according to item 9,
  wherein the n number of clock main lines are provided between the outer main line and the inner main line.

Item 11
  The display apparatus according to any one of items 1 to 8,
  wherein the outer main line is disposed farther from the display region than the shift register, and the inner main line is provided between the shift register and the display region.

Item 12
  The display apparatus according to any one of items 1 to 8,
  wherein the outer main line is disposed farther from the display region than the shift register, and the inner main line overlaps a region extending in the column direction, the region being defined by the plurality of unit circuits constituting the shift register.

Item 13
  The display apparatus according to item 11 or 12,
  wherein the n number of clock main lines are provided between the outer main line and the shift register.

Item 14
  The display apparatus according to any one of items 11 to 13, further including
  a further main line provided in the first peripheral region, the further main line extending in the column direction, the further main line being configured to supply another common signal to the plurality of stages of the shift register,
  wherein the further main line is provided between the n number of clock main lines and the shift register.

Item 15
  The display apparatus according to any one of items 11 to 14,
  wherein the at least one branch wiring line in the first unit region includes a branch wiring line extending in the row direction, the branch wiring line including a main line intersecting section overlapping the n number of clock main lines, and a shift register section overlapping a region extending in the column direction, the region being defined by the plurality of unit circuits constituting the shift register, a width of the main line intersecting section in the column direction being larger than a width of the shift register section in the column direction.

Item 16
  The display apparatus according to any one of items 1 to 15,
  wherein the common signal is a signal configured to provide a low-level potential or a signal configured to provide a high-level potential.

Item 17
The display apparatus according to any one of items 1 to 16, further including
another outer main line and another inner main line provided in the first peripheral region, each of the other outer main line and the other inner main line extending in the column direction, the other outer main line and the other inner main line being configured to supply another common signal to the plurality of stages of the shift register, and
another plurality of branch wiring lines provided in the first peripheral region, each of the other plurality of branch wiring lines electrically connecting the other outer main line and the other inner main line.

Item 18
The display apparatus according to item 17,
wherein the other plurality of branch wiring lines include at least one other branch wiring line for each unit region, and
a resistance value of the at least one other branch wiring line between the other outer main line and the other inner main line in the first unit region is smaller than a resistance value of the at least one other branch wiring line between the other outer main line and the other inner main line in the second unit region.

Item 19
A display panel including a plurality of pixels arrayed in a matrix including a plurality of pixel rows and a plurality of pixel columns, a display region defined by the plurality of pixels, a first peripheral region adjacent to the display region in a row direction, and a second peripheral region adjacent to the display region in a column direction, the display panel including
a gate drive circuit provided in the first peripheral region, the gate drive circuit including a shift register, the shift register including a plurality of stages individually corresponding to the plurality of pixel rows,
n number of clock main lines provided in the first peripheral region, where n is an integer being equal to or larger than 2, each of the n number of clock main lines extending in the column direction, the n number of clock main lines being configured to supply n number of types of clock signals having different phases from one another to the plurality of stages included in the shift register,
an outer main line and an inner main line provided in the first peripheral region, each of the outer main line and the inner main line extending in the column direction, the outer main line and the inner main line being configured to supply a common signal to the plurality of stages included in the shift register, and
a plurality of branch wiring lines provided in the first peripheral region, each of the plurality of branch wiring lines electrically connecting the outer main line and the inner main line,
wherein the second peripheral region includes a terminal portion including an outer main line terminal electrically connected to the outer main line, and n number of clock main line terminals individually electrically connected to the n number of clock main lines,
the first peripheral region includes a plurality of unit regions arrayed in the column direction, the plurality of unit regions individually corresponding to the n number of stages included in the shift register, the n number of stages being configured to be supplied with the n number of types of clock signals having different phases from one another from the n number of clock main lines,
the plurality of branch wiring lines include at least one branch wiring line for each unit region, and
the plurality of unit regions include a first unit region and a second unit region, the first unit region being disposed closer to the terminal portion than the second unit region, a resistance value of the at least one branch wiring line between the inner main line and the outer main line in the first unit region being smaller than a resistance value of the at least one branch wiring line between the inner main line and the outer main line in the second unit region.

Advantageous Effects of Disclosure

According to the embodiments of the disclosure, the display apparatus that suppresses heat generation in the peripheral region and the display panel to be used in such a display apparatus are provided.

BRIEF DESCRIPTION OF DRAWINGS

FIG. 2 is a schematic plan view of the display apparatus 1100a.

DETAILED DESCRIPTION

Hereinafter, embodiments of the disclosure will be described with reference to the accompanying drawings. Note that a liquid crystal display device will be described below as an example of a display apparatus according to the embodiments of the disclosure, but the present invention is not limited to the following embodiments. In the following drawings, constituent elements having a substantially identical function may be denoted by a common reference sign and description thereof may be omitted.

First Embodiment

Figure 1:
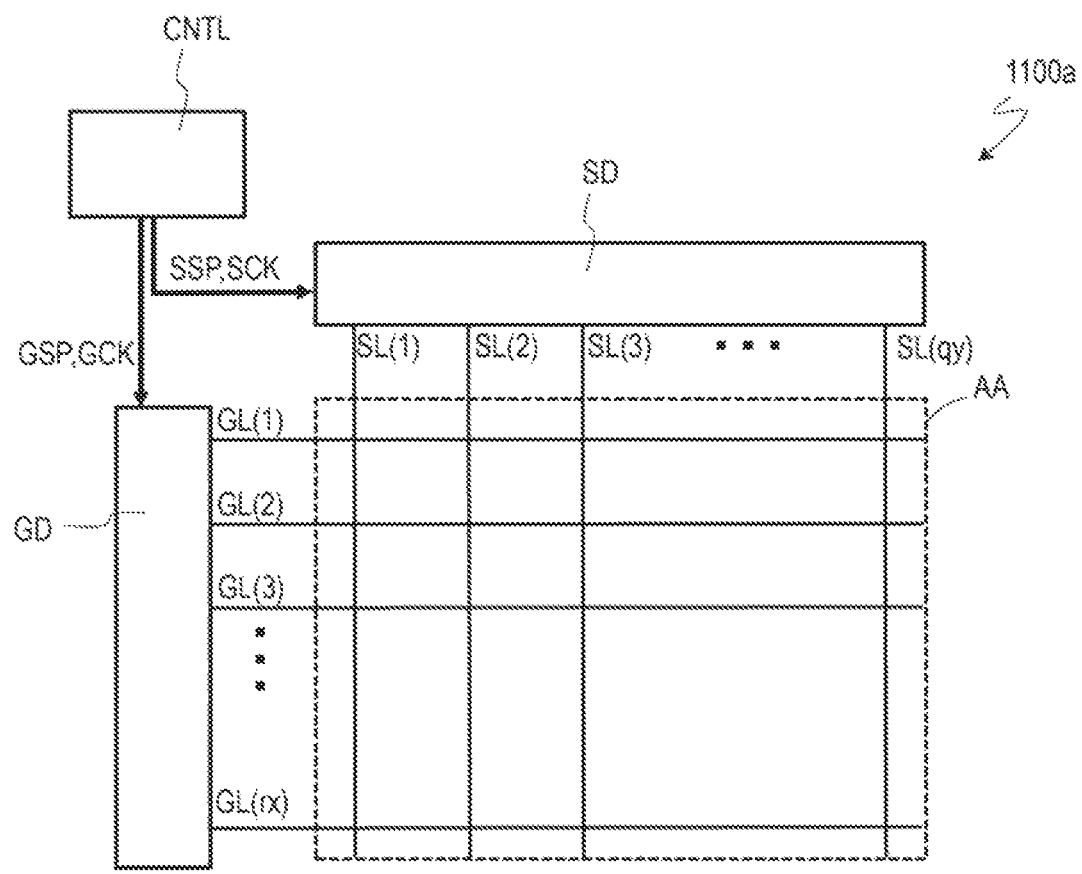
FIG. 1 is a diagram schematically illustrating a configuration of a display apparatus 1100a according to a first embodiment of the disclosure.
Figure 2:
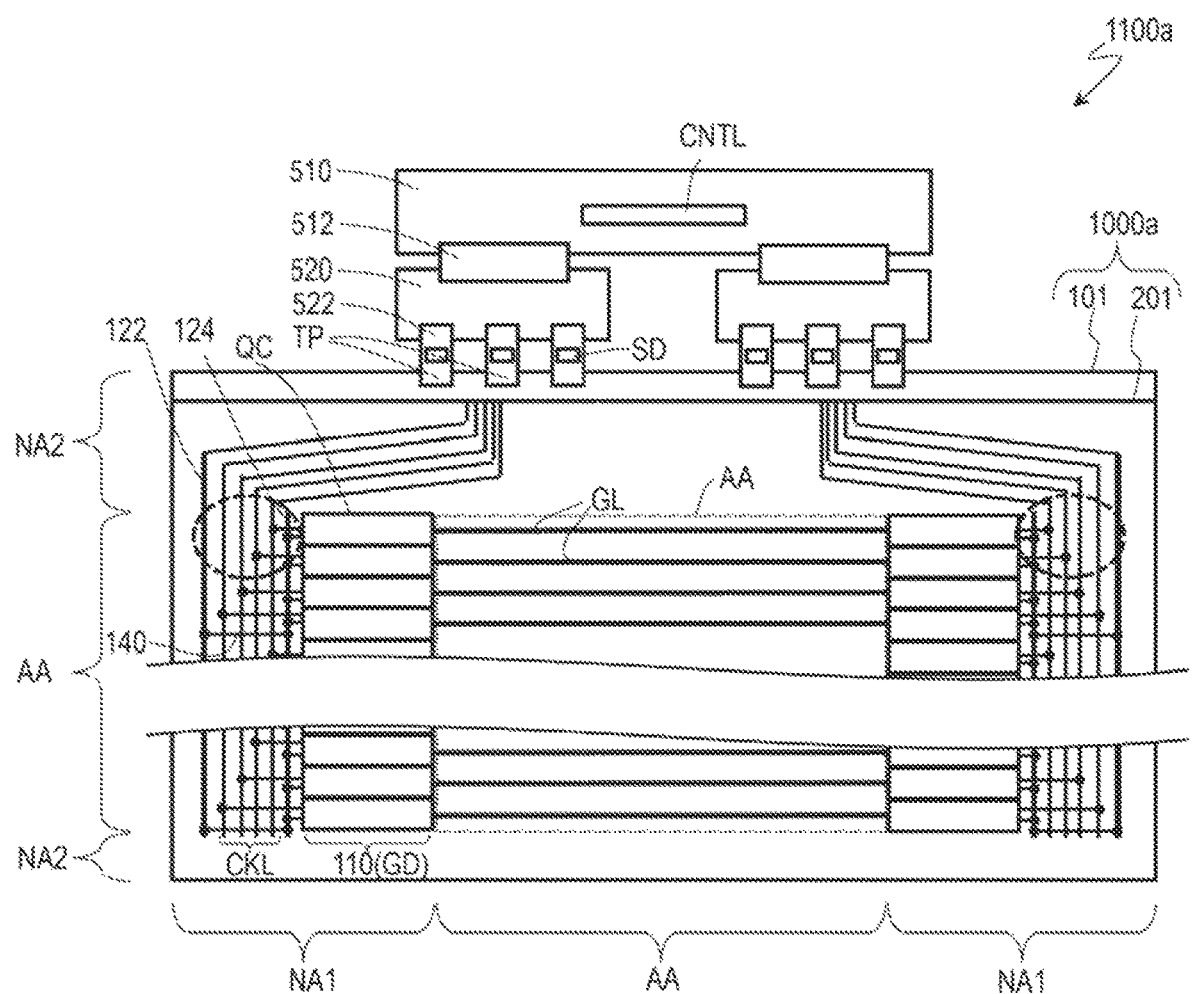
Figure 3A:
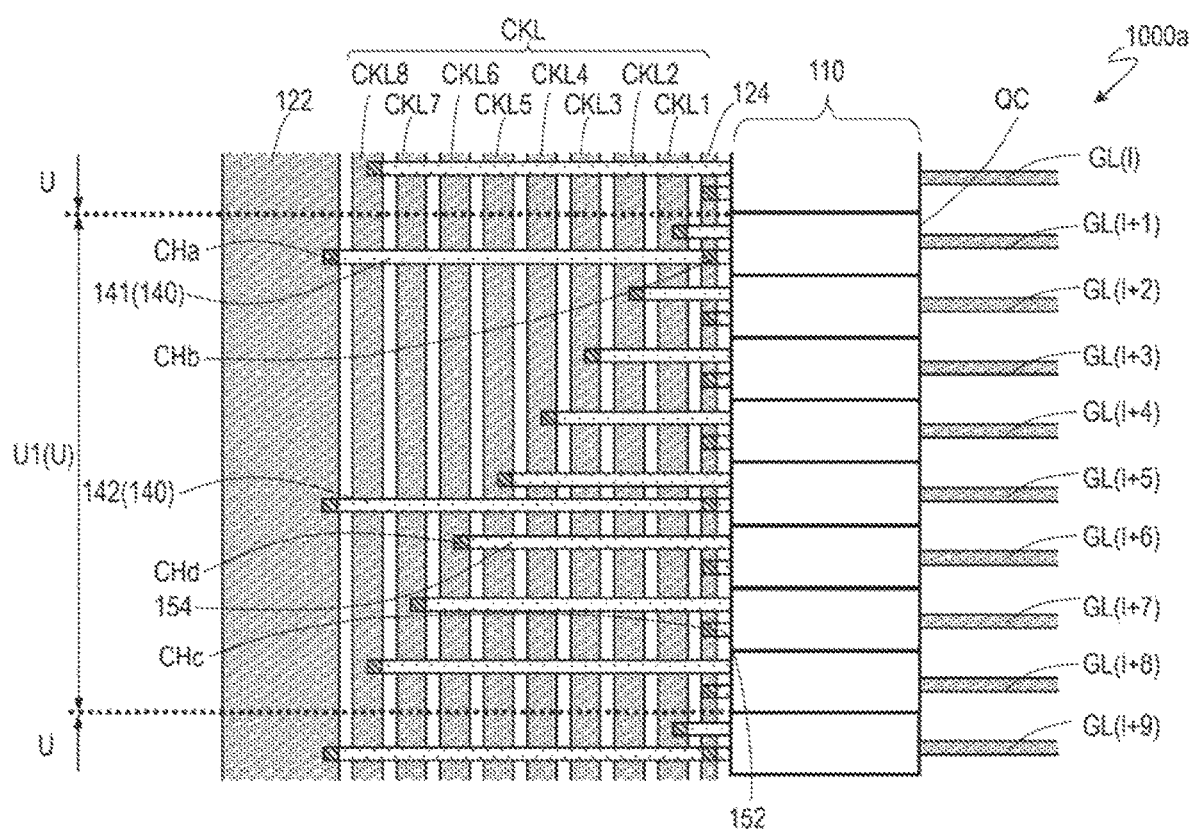
FIG. 3A is a schematic plan view of a display panel 1000a included in the display apparatus 1100a, and is a plan view illustrating a region including a first unit region U1 of a first peripheral region NA1.
Figure 3B:
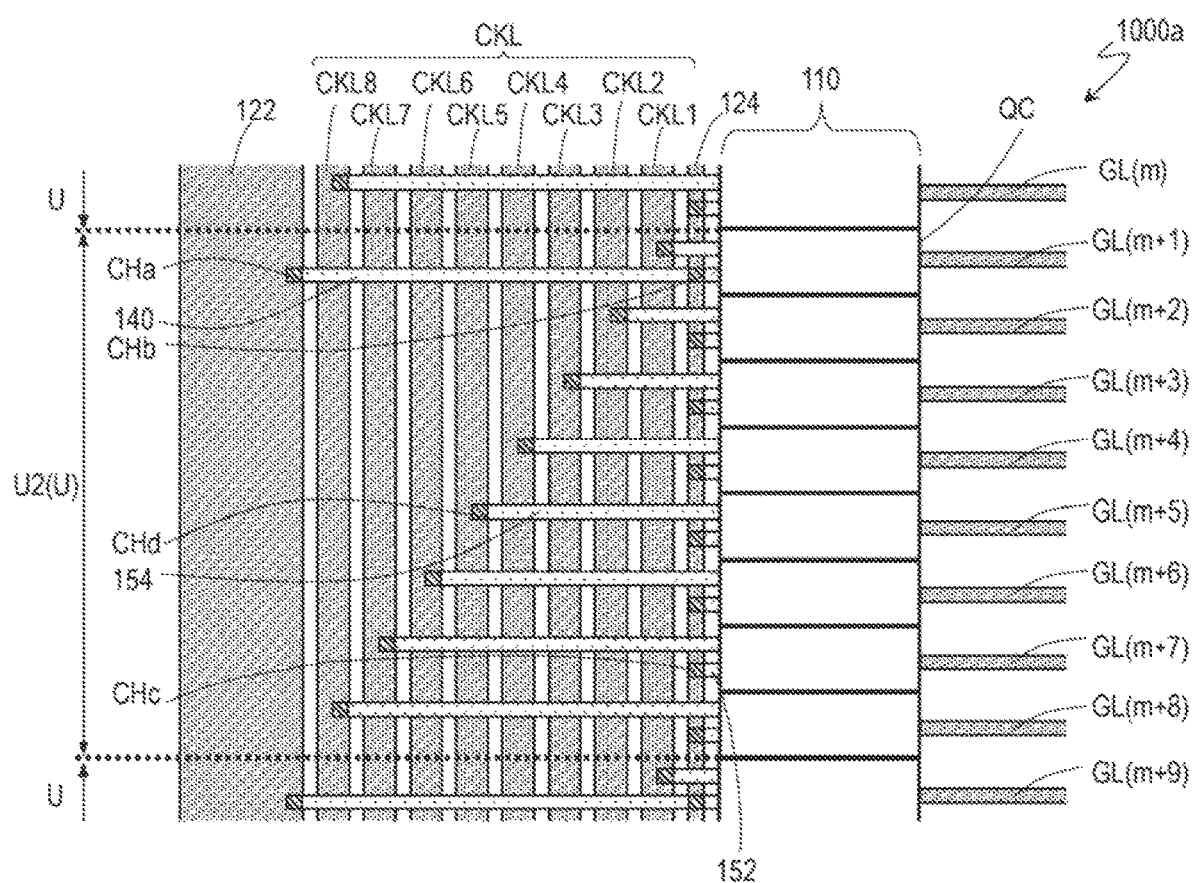
FIG. 3B is a schematic plan view of the display panel 1000a, and is a plan view illustrating a region including a second unit region U2 of the first peripheral region NA1.

Referring to FIG. 1, FIG. 2, FIG. 3A, and FIG. 3B, a liquid crystal display device 1100a according to the embodiments of the disclosure and a liquid crystal display panel 1000a included in the liquid crystal display device 1100a (that may be referred to as a "display apparatus 1100a" and a "display panel 1000a") will be described. FIG. 1 is a schematic diagram illustrating a configuration of the display apparatus 1100a, FIG. 2 is a schematic plan view of the display apparatus 1100a, and FIG. 3A and FIG. 3B are schematic plan views of the display panel 1000a.

The display apparatus 1100a includes a plurality of pixels arrayed in a matrix including a plurality of pixel rows and a plurality of pixel columns. The pixel row is a plurality of pixels arrayed in a row direction (an X direction in FIG. 2), and the pixel column is a plurality of pixels arrayed in a column direction (a Y direction in FIG. 2). The display apparatus 1100a includes the display panel 1000a and a circuit substrate 510 connected to the display panel 1000a. The display panel 1000a includes a TFT substrate 101 and a counter substrate 201 that face each other, and a liquid crystal layer provided between these substrates. As illustrated in FIG. 2, the display panel 1000a includes a display region AA defined by a plurality of pixels, first peripheral regions NA1 being adjacent to the display region AA in the row direction, and second peripheral regions NA2 being adjacent to the display region AA in the column direction. The first peripheral region NA1 and the second peripheral region NA2 may overlap with each other. The first peripheral region NA1 and the second peripheral region NA2 may be collectively referred to as a peripheral region. The peripheral region refers to a region other than the display region AA of the display panel 1000a.

In this example, each of the plurality of pixel rows is associated with a gate bus line GL, and each of the plurality of pixel columns is associated with a source bus line SL. The pixel rows are referred to as a first row, a second row, . . . , and an rx-th row in order from the top, a gate bus line associated with a pixel row at an r-th row ($1 \leq r \leq rx$) may be represented as a gate bus line GL(r) (see FIG. 1). Here, rx is the number of pixel rows included in the display apparatus 1100a. A pixel in the pixel row at the r-th row is selected by a scanning signal voltage supplied to the gate bus line GL(r). The gate bus line GL(r) associated with the pixel row at the r-th row is connected to a gate electrode of a TFT connected to a pixel included in the pixel row at the r-th row. The pixel columns are referred to as a first column, a second column, . . . , and a qy-th column, and a source bus line SL associated with a pixel column at a q-th column may be represented as a source bus line SL(q). Here, qy is the number of pixel columns included in the display apparatus 1100a. A display signal voltage is supplied from the source bus line SL(q) to pixels of the pixel column at the q-th column ($1 \leq q \leq qy$). The source bus line SL(q) associated with the pixel column at the q-th column is connected to a source electrode of a TFT connected to a pixel included in the pixel column at the q-th column.

The display panel 1000a includes a gate drive circuit GD. Here, the gate drive circuit GD is integrally formed on a TFT substrate 101 (by a gate driver monolithic technology). The gate drive circuit GD is provided in a first peripheral region NA1 of the display panel 1000a, and includes a shift register 110 including a plurality of stages individually corresponding to the plurality of pixel rows. An output of each stage of the shift register 110 is connected to the gate bus line GL associated with each of the plurality of pixel rows. Typically, the shift register 110 includes rx number of stages, and when the rx number of stages are referred to as a first stage, a second stage, . . . , and an rx-th stage in order from the top, an output of an r-th stage ($1 \leq r \leq rx$) is connected to a gate bus line GL(r). The shift register 110 is configured of a plurality of unit circuits QC being connected in cascade. Each stage of the shift register 110 is configured of each unit circuit QC.

The circuit substrate 510 includes a control circuit CNTL that supplies a control signal to the gate drive circuit GD. For example, the control circuit CNTL is implemented in the circuit substrate 510. The circuit substrate 510 is connected to a terminal portion TP included in the second peripheral region NA2 of the display panel 1000a with a source substrate 520 interposed therebetween. The circuit substrate 510 is connected to the source substrate 520 with a flexible circuit substrate (flexible printed circuits (FPC)) 512 interposed therebetween. The terminal portion TP is provided with terminals individually electrically connected to main lines configured to supply signals to the gate drive circuit GD, which will be described below. The circuit substrate 510 supplies signals through the source substrate 520 to the respective main lines configured to supply the signals to the gate drive circuit GD from the terminal portion TP of the display panel 1000a. The circuit substrate 510 is connected to the display panel 1000a with a plurality of source substrates 520 interposed therebetween in this example. Each of the source substrates 520 (printed wiring boards) is connected to the display panel 1000a with a plurality of flexible circuit substrates 522 interposed therebetween, and a source drive circuit SD that supplies a display signal voltage to the source bus line SL is mounted on the flexible circuit substrate 522. Note that in FIG. 2, the source bus lines SL are not illustrated for visibility. The control circuit CNTL also supplies a control signal to the source drive circuit SD, for example. Examples of the control signal to be supplied by the control circuit CNTL to the gate drive circuit GD include a gate start pulse signal GSP, and a gate clock signal GCK. Examples of the control signal to be supplied by the control circuit CNTL to the source drive circuit SD include a source start pulse signal SSP, and a source clock signal SCK. Note that arrangement and a connection method of the source drive circuit SD and the control circuit CNTL are not limited to those illustrated in the drawings. Additionally, in FIG. 2, the gate drive circuit GD and wiring lines configured to supply signals to the gate drive circuit GD at both the left and right sides of the display region AA are provided, but the gate drive circuit GD and the wiring lines configured to supply signals to the gate drive circuit GD may be provided only at either of the left and right sides of the display region AA.

The display panel 1000a includes the following wiring lines provided in the first peripheral region NA1 and configured to supply a signal to the gate drive circuit GD. Specifically, the display panel 1000a includes n number of clock main lines CKL1 to CKLn configured to supply n number of types of clock signals having different phases from one another (n is an integer being equal to or larger than 2) to the plurality of stages included in the shift register 110, each of then number of clock main lines CKL1 to CKLn extending in the column direction, and an outer main line 122 and an inner main line 124 configured to supply a common signal to the plurality of stages included in the shift register 110, each of the outer main line 122 and the inner main line 124 extending in the column direction, and a plurality of branch wiring lines 140 individually electrically connect the outer main line 122 and the inner main line 124. The terminal portion TP in the second peripheral region NA2 of the display panel 1000a is provided with terminals (n number of clock main line terminals and an outer main line terminal) individually electrically connected to the n number of clock main lines CKL1 to CKLn and the outer main line 122.

As the n number of clock main lines CKL1 to CKLn, in the example illustrated in FIG. 3A and FIG. 3B, eight clock main lines CKL1 to CKL8 are provided (n=8). When gate clock signals GCK supplied from the clock main line CKL1 to CKL8 are respectively represented as GCK1 to GCK8, the gate clock signals GCK1 to GCK8 are, for example, an oscillating voltage at a cycle of 8H (1H is one horizontal scan period), the oscillating voltage having a duty ratio of 1:1 (the oscillating voltage is at a high level for 4H and is at a low level for 4H in one cycle of 8H), and have different phases from one another by 1H. For example, a low-level potential Vgl is set to −7 V and a high-level potential Vgh is set to 35 V. The terminal portion TP in the second peripheral region NA2 of the display panel 1000a is provided with terminals (eight clock main line terminals) individually electrically connected to the clock main lines CKL1 to CKL8, and the gate clock signals GCK1 to GCK8 are individually supplied to the clock main lines CKL1 to CKL8 connected via the clock main line terminals from the control circuit CNTL. The respective clock main lines CKL1 to CKL8 and inputs (input terminals) of the stages included in the shift register 110 are electrically connected through wiring lines 154 extending in the row direction, so that the gate clock signals GCK1 to GCK8 are individually supplied to the inputs of the stages included in the shift register 110. Each of the clock main lines CKL1 to CKL8 and the wiring line 154 are connected in a contact hole CHd. An example of connection relationships between the inputs of the stages of the shift register 110 and then number of clock main lines CKL1 to CKLn is as follows. For example, the gate clock signals GCK1 to GCK8 are respectively supplied from the clock main lines CKL1 to CKL8 to inputs of first to eighth stages, the gate clock signals GCK1 to GCK8 are respectively supplied from the clock main lines CKL1 to CKL8 to inputs of ninth to sixteenth stages, the gate clock signals GCK1 to GCK8 are respectively supplied from the clock main lines CKL1 to CKL8 to inputs of seventeenth to twenty-fourth stages, and a similar operation is repeated. That is, an input of the $\{(a \times n)+k\}$-th stage of the shift register 110 is supplied with the gate clock signal GCKk from the clock main line CKLk (where a is an integer being equal to or larger than 0, and k is an integer being equal to or larger than 1 and being equal to or smaller than n).

The outer main line 122 and the inner main line 124 are configured to provide a signal that applies a low-level potential (for example, VSS=−7 V) to the plurality of stages of the shift register 110, for example. A signal that applies a fixed potential (for example, a signal that applies the low-level potential VSS) is supplied to the outer main line 122 connected via the outer main line terminal from the control circuit CNTL. The outer main line 122 and the inner main line 124 are electrically connected to each other through the branch wiring line 140, and the inner main line 124 and an input (input terminal) of each stage of the shift register 110 are electrically connected through the wiring line 152, so that the signal that applies the low-level potential VSS is supplied to the input of each stage of the shift register 110. The outer main line 122 and the branch wiring line 140 are connected in a contact hole CHa, the inner main line 124 and the branch wiring line 140 are connected in a contact hole CHb, and the inner main line 124 and the wiring line 152 are connected in a contact hole CHc.

Note that the outer main line 122 and the inner main line 124 may be configured to supply a signal VD that applies a high-level potential (which may be different from Vgh) to the plurality of stages of the shift register 110, for example. The signal VD that applies the high-level potential may be supplied to the outer main line 122 connected via the outer main line terminal from the control circuit CNTL.

In this example, the inner main line 124 is disposed farther from the display region AA than the shift register 110, and the outer main line 122 is disposed farther from the display region AA than the inner main line 124. The eight clock main lines CKL1 to CKL8 are provided between the outer main line 122 and the inner main line 124. A width of the outer main line 122 in the row direction is typically larger than a width of the inner main line 124 in the row direction.

The first peripheral region NA1 includes a plurality of unit regions U arrayed in the column direction. That is, the first peripheral region NA1 is divided into a plurality of unit regions U arrayed in the column direction. Each unit region U is a region corresponding to n number of stages of the shift register 110 to which n number of types of clock signals having different phases from one another are supplied from the n number of clock main lines CKL1 to CKLn. For example, each unit region U is obtained by dividing the first peripheral region NA in the column direction in a manner to include n number of unit circuits QC adjacent to each other in the column direction, the n number of unit circuits QC constituting then number of stages of the shift register 110. Each unit region U may be a region corresponding to the n number of pixel rows associated with then number of clock main lines CKL1 to CKLn. The pixel row associated with one clock main line CKL is a pixel row selected by the scanning signal voltage supplied to the gate bus line GL connected to an output of the stage of the shift register 110 to which the gate clock signal is supplied from the one clock main line CKL.

The plurality of branch wiring lines 140 include at least one branch wiring line 140 for each unit region U. That is, at least one branch wiring line 140 that electrically connects the outer main line 122 and the inner main line 124 is provided in each unit region U.

The plurality of unit regions U include the first unit region U1 and the second unit region U2, the first unit region U1 is disposed closer to the terminal portion TP than the second unit region U2, and a resistance value of the at least one branch wiring line 140 between the outer main line 122 and the inner main line 124 in the first unit region U1 (which may be simply referred to as a resistance value of the branch wiring line 140 in the first unit region U1) is smaller than a resistance value of the at least one branch wiring line 140 between the outer main line 122 and the inner main line 124 in the second unit region U2 (which may be simply referred to as a resistance value of the branch wiring line 140 in the second unit region U2). That is, the plurality of unit regions U constituting the first peripheral region NA1 include a unit region U1 disposed closer to the terminal portion TP than other unit regions U2, the unit region U1 having a resistance value of the branch wiring line 140 between the outer main line 122 and the inner main line 124 for each unit region U being smaller than those of the other unit regions U2. The resistance value of the branch wiring line 140 between the outer main line 122 and the inner main line 124 for each unit region U refers to a combined resistance value of a plurality of branch wiring lines 140 when the plurality of branch wiring lines 140 are provided in the unit region U. The branch wiring line 140 is not limited to a branch wiring line that directly connects the outer main line 122 and the inner main line 124, but also includes a branch wiring line that indirectly electrically connects the outer main line 122 and the inner main line 124. Among the plurality of unit regions U constituting the first peripheral region NA1, one unit region U closest to the terminal portion TP may be the first unit region U1, or each of the plurality of unit regions U being adjacent to each other, the plurality of unit regions U including the unit region U closest to the terminal portion TP, may be the first unit region U1. Among the plurality of unit regions U constituting the first peripheral region NA1, each of a plurality of unit regions U other than the first unit region U1 may be the second unit region U2.

In the example of the display panel 1000a, the number of branch wiring lines 140 in the first unit region U1 is larger than the number of branch wiring lines 140 in the second unit region U2, like the first unit region U1 illustrated in FIG. 3A and the second unit region U2 illustrated in FIG. 3B. Two branch wiring lines 140 (branch wiring lines 141 and 142) are provided in the first unit region U1, whereas only one branch wiring line 140 is provided in the second unit region U2. Here, the resistance value of the branch wiring line 140 in the second unit region U2 is equal to the resistance value of at least one (here, the branch wiring line 141) of the two branch wiring lines 141 and 142 in the first unit region U1. At this time, as will be described below, the resistance value of the branch wiring line 140 between the outer main line 122 and the inner main line 124 for each unit region U in the first unit region U1 is smaller than that in the second unit region U2. The resistance value of the branch wiring line 140 between the outer main line 122 and the inner main line 124 in the first unit region U1 is a combined resistance value of the two branch wiring lines 141 and 142. When a resistance value of the branch wiring line 141 is represented by R1, and a resistance value of the branch wiring line 142 is represented by R2, a combined resistance value R of the two branch wiring lines 141 and 142 connected in parallel is represented by $R=(R1 \times R2)/(R1+R2)$, and R is certainly smaller than the resistance value R1 of the branch wiring line 140 between the outer main line 122 and the inner main line 124 in the unit region U2 (an equation of $R/R1=R2/(R1+R2)$ is satisfied, and both R1 and R2 are positive values, resulting in satisfying a relationship of $R/R1<1$). Furthermore, when the resistance value R1 of the branch wiring line 141 and the resistance value R2 of the branch wiring line 142 are equal to each other ($R1=R2$), the combined resistance value R of the two branch wiring lines 141 and 142 is expressed by $R=R1/2$. Note that, in practice, because of, for example, occurrence of a voltage drop caused by a wiring line resistance, it is conceivable that the combined resistance is not simply determined as described above, but the fact that the resistance value of the branch wiring line 140 between the outer main line 122 and the inner main line 124 for each unit region U in the first unit region U1 is smaller than that in the second unit region U2 is not changed.

Without being limited to this example, the plurality of unit regions U constituting the first peripheral region NA1 may be configured so as to include a unit region (first unit region) having a small resistance value of the branch wiring line 140 electrically connecting the outer main line 122 and the inner main line 124, the unit region being disposed closer to the terminal portion TP than the other unit regions (second unit regions). For example, as long as the branch wiring line 140 provided in the first unit region U1 and the branch wiring line 140 provided in the second unit region U2 are formed of materials having an identical resistivity, and have an identical thickness, it is sufficient that a total area of the branch wiring line 140 provided in the first unit region U1 is larger than a total area of the branch wiring line 140 provided in the second unit region U2. An area of the branch wiring line 140 refers to an area of the branch wiring line 140 when viewed from a normal direction of the TFT substrate 101, for example. Other modified examples will be described below with reference to FIG. 5A, FIG. 5B, FIG. 6A and FIG. 6B, and the like.

Since the resistance value of the branch wiring line 140 in the first unit region U1 is smaller than the resistance value of the branch wiring line 140 in the second unit region U2, the display panel 1000a suppresses heat generation of the branch wiring line 140 in the first unit region U1.

Here, an effect obtained by the display panel of the present embodiment will be described as compared to display panels of Comparative Examples.

A display panel of a first Comparative Example is different from the display panel 1000a in that resistance values of the branch wiring lines 140 are identical in all the unit regions U. The display panel of the first Comparative Example has a substantially identical structure to that of the second unit region U2 of the display panel 1000a in all the unit regions U. The display panel of the first Comparative Example corresponds to, for example, a liquid crystal display device of WO 2011/065045.

In the display panel of the first Comparative Example, excessive heat generation may locally occur in a region close to the terminal portion TP (for example, a region corresponding to an oval indicated by a dashed line in FIG. 2), of a region where a wiring line group is disposed in the first peripheral region NA1. The region in which the wiring line group is disposed in the first peripheral region NA1 refers to a region in which the outer main line 122, the inner main line 124, and the clock main lines CKL, and wiring lines (including the branch wiring lines 140, the wiring lines 152, the wiring lines 154, and the like) configured to connect the outer main line 122, the inner main line 124, and the clock main lines CKL to the shift register 110 (the gate drive circuit GD) are provided. Local and excessive heat generation is particularly likely to occur in a display panel having any feature of a large type (70 inch or more), high definition (8K or more), and high frequency driving (120 Hz or more). Furthermore, the problem of excessive heat generation remarkably occurs in a display panel made by adopting a gate driver monolithic (GDM) technology in which the gate drive circuit GD is integrally formed on the TFT substrate 101. Of the region in which the wiring line group is disposed in the first peripheral region NA1, a region closer to the terminal portion TP is likely to generate heat, because the region includes a portion before branching a current in a corresponding manner to the respective stages of the shift register 110 among the main lines to which the control signal is supplied from the control circuit CNTL via the terminal portion TP. Depending on models, of the region where the wiring line group is disposed in the first peripheral region NA1, the heat generation is most likely to occur in a region having a distance of approximately 20 mm from the terminal portion TP side. An amount of heat generation tends to decrease as the distance from the terminal portion TP becomes larger. Furthermore, the heat generation is also caused by capacitive coupling between wiring lines, for example, by formation of a parasitic capacitance between the branch wiring line 140 and the clock main line CKL. Here, the outer main line 122, the inner main line 124, and the clock main lines CKL are formed by patterning a conductive film for forming a gate metal layer (a conductive layer including a gate electrode of a TFT and the gate bus line GL), and the branch wiring line 140 is formed by patterning a conductive film for forming a source metal layer (a conductive layer including a source electrode of the TFT and the source bus line SL). In the drawings (for example, FIG. 3A and FIG. 3B), wiring lines included in an identical conductive layer are illustrated by using an identical type of hatching.

In the display panel 1000a of the present embodiment, a resistance value of the branch wiring line 140 is suppressed low in the first unit region U1 disposed closer to the terminal portion TP, and thus, heat generation can be suppressed compared to that in the display panel of the first Comparative Example. Note that in the display panel 1000a of the present embodiment, the number of branch wiring lines 140 in the first unit region U1 is larger than that in the second unit region U2, and thus, an overlapping area of the branch wiring line 140 and the clock main line CKL is large. This causes the parasitic capacitance between the branch wiring line 140 and the clock main line CKL to increase, but all the unit regions U are not set as the first unit region U1, so that a larger effect of suppressing heat generation due to a decrease in resistance value of the branch wiring line 140 in a region where the heat generation is likely to occur can be obtained.

Figure 4:
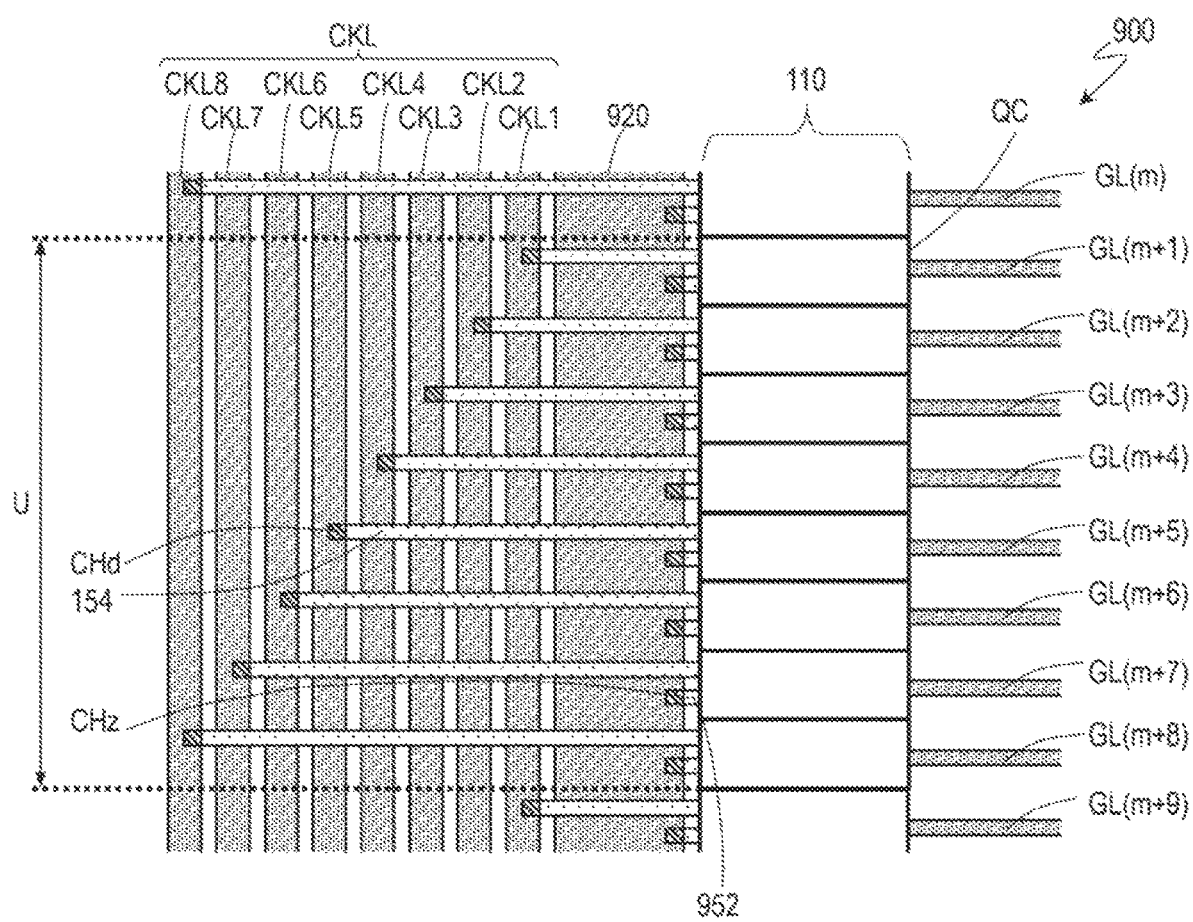
FIG. 4 is a schematic plan view of a display panel 900 of a second Comparative Example, and is a plan view illustrating a region including a unit region U of the first peripheral region NA1.

FIG. 4 illustrates a schematic plan view of a display panel 900 of a second Comparative Example. The display panel 900 of the second Comparative Example differs from the display panel of the first Comparative Example in that the display panel 900 has only a main line 920 instead of the outer main line 122 and the inner main line 124. The display panel 900 of the second Comparative Example has an identical structure in all unit regions U. Referring to the display panel 900 of the second Comparative Example, an effect of the fact that the display panel 1000a according to the present embodiment has the outer main line 122 and the inner main line 124 will be described.

In order to sufficiently reduce a resistance value of the main line 920, it is preferable that a width of the main line 920 (a width in the row direction) be large. However, in the display panel 900 of the second Comparative Example, the larger the width of the main line 920 is, the larger an area where the wiring line 154 connecting each clock main line CKL and each stage of the shift register 110 overlaps the main line 920 is, and the larger a parasitic capacitance formed therebetween is.

In comparison, the display panel 1000a of the present embodiment is provided with, as illustrated in FIG. 3A and FIG. 3B, the outer main line 122 and the inner main line 124, which are electrically connected by using the branch wiring lines 140. When the width of the outer main line 122 in the row direction is set to be large, the width of the inner main line 124 in the row direction can be reduced while reducing the resistance value of the outer main line 122, and thus, an overlapping area of the wiring line 154 that connects each clock main line CKL and each stage of the shift register 110 and the inner main line 124 can be suppressed small. The width of the outer main line 122 in the row direction is, for example, 400 μm, the width of the inner main line 124 in the row direction is, for example, 50 µm, and the width of the branch wiring line 140 in the column direction is, for example, 7 µm.

Figure 5A:
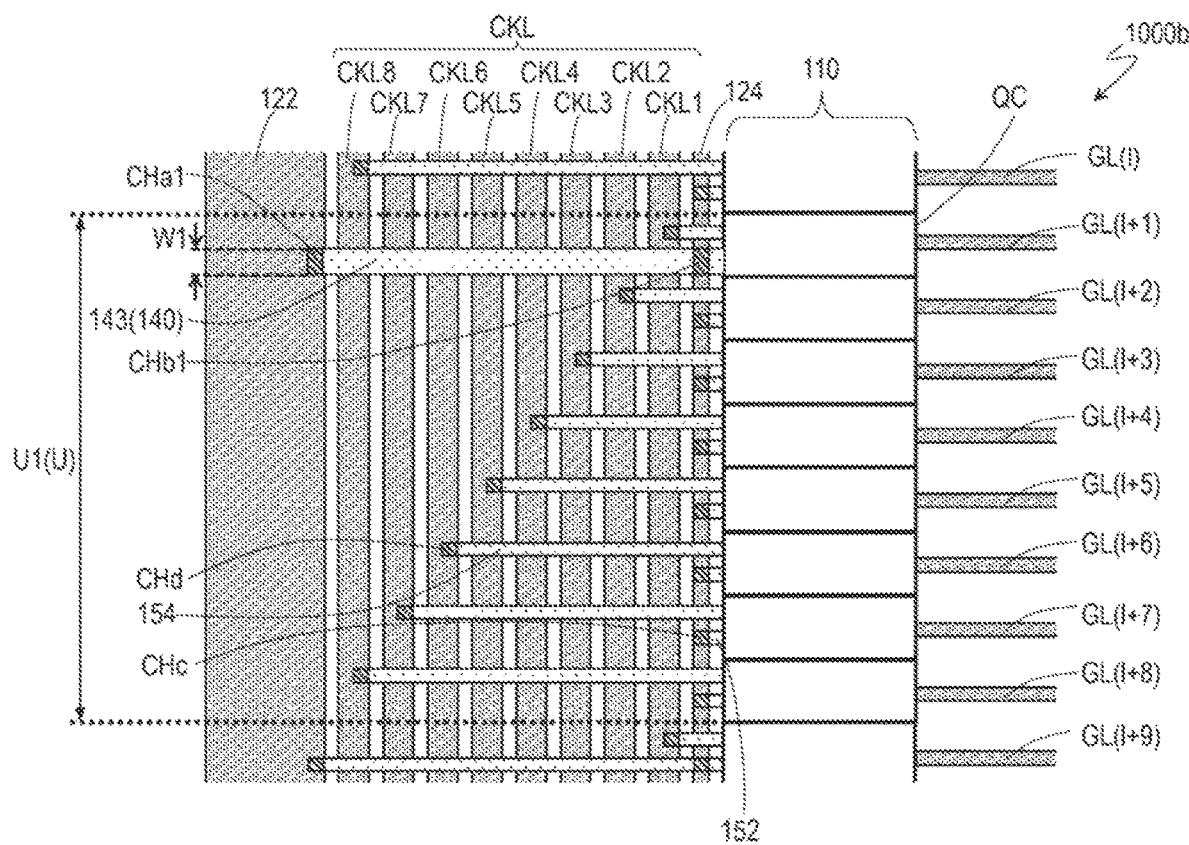
FIG. 5A is a schematic plan view of a display panel 1000b according to a modified example of the first embodiment, and is a plan view illustrating a region including the first unit region U1 of the first peripheral region NA1.
Figure 5B:
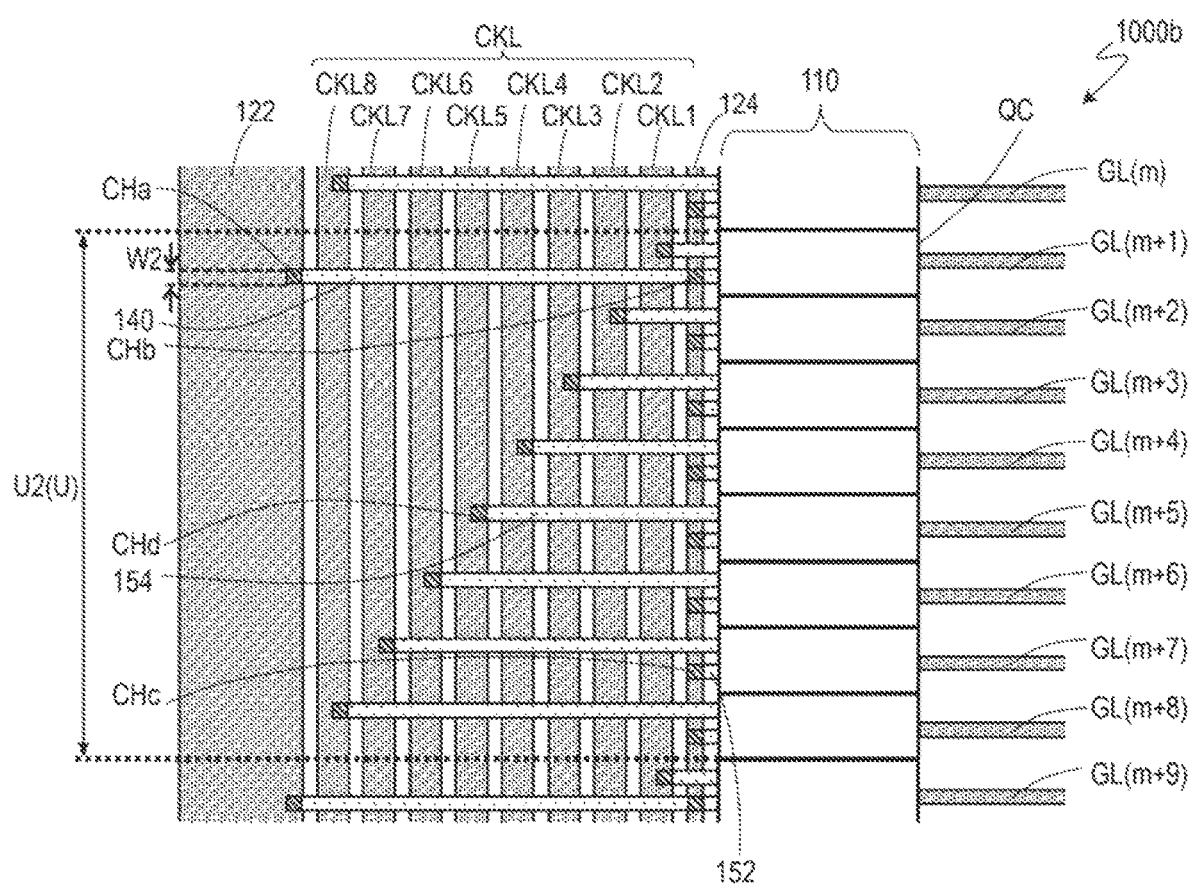
FIG. 5B is a schematic plan view of the display panel 1000b, and is a plan view illustrating a region including the second unit region U2 of the first peripheral region NA1.

A display panel 1000*b* according to a modified example of the present embodiment will be described with reference to FIG. 5A and FIG. 5B. FIG. 5A illustrates the first unit region U1, and FIG. 5B illustrates the second unit region U2. Differences from the display panel 1000*a* will be mainly described.

In the display panel 1000*b*, the number of branch wiring lines 140 provided in the first unit region U1 and the number of branch wiring lines 140 provided in the second unit region U2 are equal to each other, but a width W1 in the column direction of a branch wiring line 143 provided in the first unit region U1 is larger than a width W2 in the column direction of the branch wiring line 140 provided in the second unit region U2. Thus, the resistance value of the branch wiring line 140 between the outer main line 122 and the inner main line 124 for each unit region U in the first unit region U1 is smaller than that in the second unit region U2. In the example illustrated in FIG. 5A and FIG. 5B, one branch wiring line 140 is provided in each of the first unit region U1 and the second unit region U2, but a plurality of branch wiring lines 140 may be provided in each of the first unit region U1 and the second unit region U2. In this case, the width W1 in the column direction of at least one branch wiring line 140 among the plurality of branch wiring lines 140 provided in the first unit region U1 may be larger than the width W2 in the column direction of at least one branch wiring line 140 among the plurality of branch wiring lines 140 provided in the second unit region U2. When the width W1 in the column direction of each of the plurality of branch wiring lines 140 provided in the first unit region U1 and the width W2 in the column direction of each of the plurality of branch wiring lines 140 provided in the second unit region U2 are compared to each other, the width W1 of the branch wiring line 140 in the column direction may be larger than the width W2 of the branch wiring line 140 in the column direction in some or all compared combinations.

As described above, here, the outer main line 122, the inner main line 124, and the clock main lines CKL are included in the gate metal layer, and the branch wiring lines 140 are included in the source metal layer. The outer main line 122 and the branch wiring line 140 are connected in the contact hole CHa, and the inner main line 124 and the branch wiring line 140 are connected in the contact hole CHb. The contact hole CHa and the contact hole CHb are formed in an insulating layer between the gate metal layer and the source metal layer. A positional relationship between the gate metal layer and the source metal layer is not considered, and either of them may be positioned at an upper side. An overlapping area of the branch wiring line 140 and the outer main line 122 in a contact hole CHa1 in the first unit region U1 is larger than an overlapping area of the branch wiring line 140 and the outer main line 122 in the contact hole CHa in the second unit region U2. In addition, an overlapping area of the branch wiring line 140 and the inner main line 124 in a contact hole CHb1 in the first unit region U1 is larger than an overlapping area of the branch wiring line 140 and the inner main line 124 in the contact hole CHb in the second unit region U2. Here, when the plurality of branch wiring lines 140 are provided in the first unit region U1, the overlapping area of the branch wiring line 140 and the outer main line 122 in the contact hole CHa1 in the first unit region U1 refers to a total area of a plurality of regions overlapping in the contact hole CHa1, and the overlapping area of the branch wiring line 140 and the inner main line 124 in the contact hole CHb1 in the first unit region U1 refers to a total area of a plurality of regions overlapping in the contact hole CHb1. When the plurality of branch wiring lines 140 are provided in the second unit region U2, the overlapping area of the branch wiring line 140 and the outer main line 122 in the contact hole CHa in the second unit region U2 refers to a total area of a plurality of regions overlapping in the contact hole CHa, and the overlapping area of the branch wiring line 140 and the inner main line 124 in the contact hole CHb in the second unit region U2 refers to a total area of the plurality of regions overlapping in the contact hole CHb. The same applies to the other embodiments.

The display apparatus using the display panel 1000*b* also suppresses heat generation in the peripheral region, as with the display apparatus 1100*a*.

Note that, in the drawings, an example is illustrated in which all the regions overlapping the outer main line 122 and the branch wiring line 140 are included in the contact hole CHa, but the contact hole CHa is not limited thereto, and a shape and a size of the contact hole CHa can be appropriately modified. The same applies to other contact holes unless otherwise indicated.

Figure 6A:
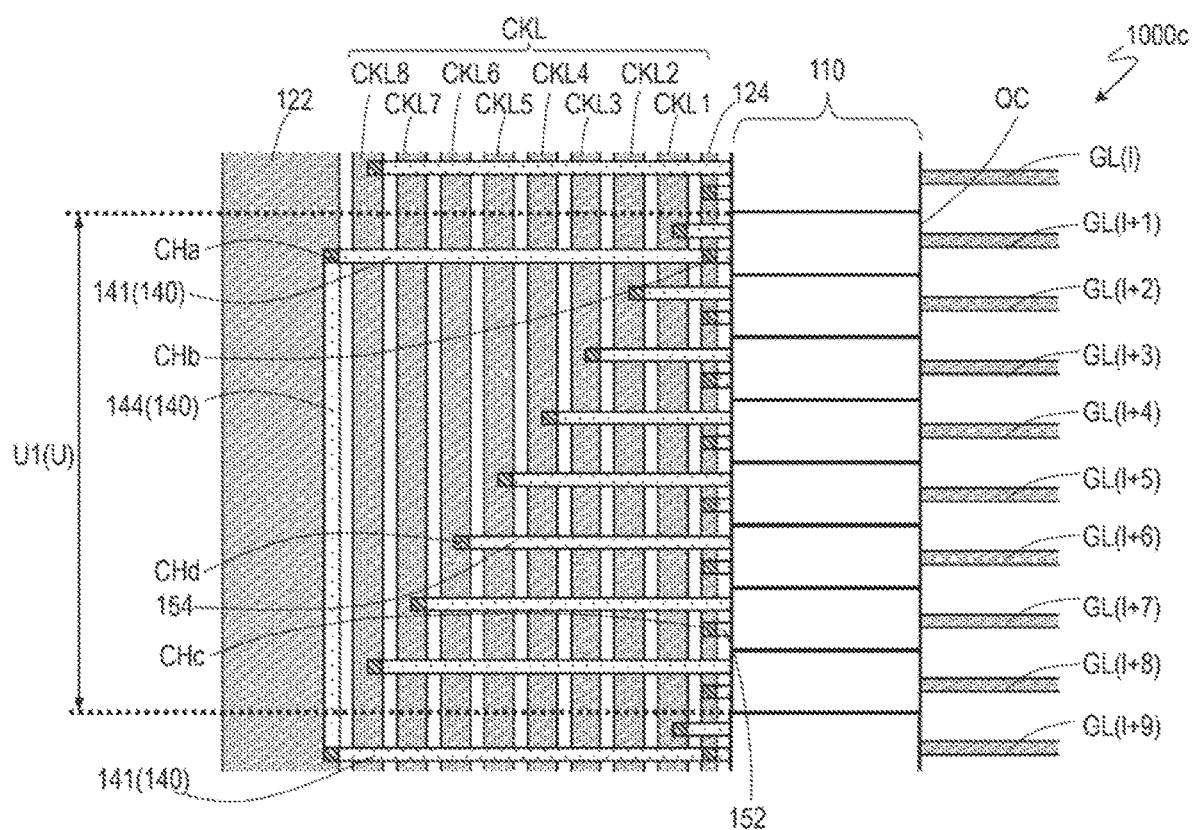
FIG. 6A is a schematic plan view of a display panel 1000c according to another modified example of the first embodiment, and is a plan view illustrating a region including the first unit region U1 of the first peripheral region NA1.
Figure 6B:
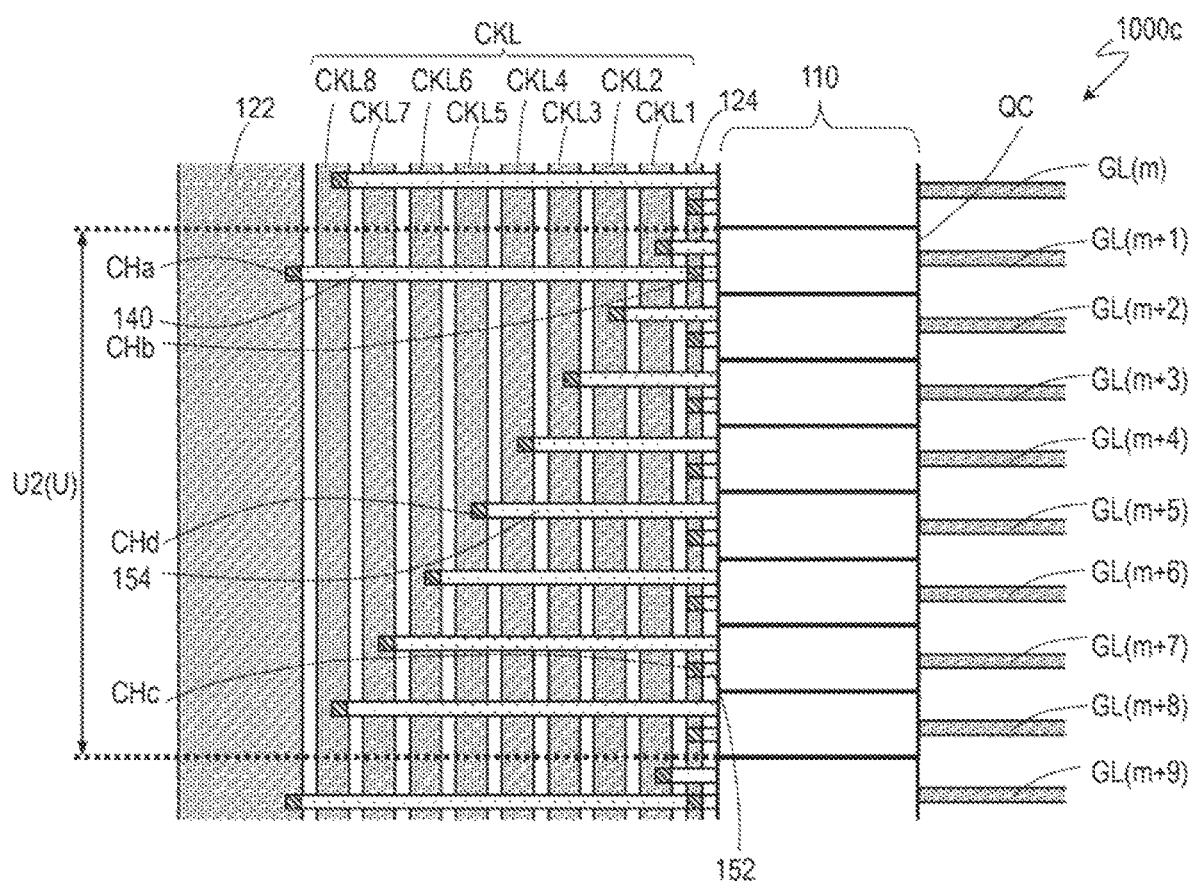
FIG. 6B is a schematic plan view of the display panel 1000c, and is a plan view illustrating a region including the second unit region U2 of the first peripheral region NA1.

Referring to FIG. 6A and FIG. 6B, a display panel 1000*c* according to another modified example of the present embodiment will be described. FIG. 6A illustrates the first unit region U1, and FIG. 6B illustrates the second unit region U2.

The display panel 1000*c* includes the branch wiring line 141 extending in the row direction and being provided in the first unit region U1, the branch wiring line 141 extending in the row direction and being provided in the unit region U adjacent to the first unit region U1 in the column direction, and the contact branch wiring line 144 extending in the column direction and electrically connecting these branch wiring lines 141. The contact branch wiring line 144 is not provided in the second unit region U2. Only the branch wiring lines 140 extending in the row direction are provided in the second unit region U2. Thus, the resistance value of the branch wiring line 140 between the outer main line 122 and the inner main line 124 for each unit region U in the first unit region U1 is smaller than that in the second unit region U2. In the illustrated example, the contact branch wiring line 144 is provided to overlap the outer main line 122.

The display apparatus using the display panel 1000*c* also suppresses heat generation in the peripheral region, as with the display apparatus 1100*a*.

Figure 7A:
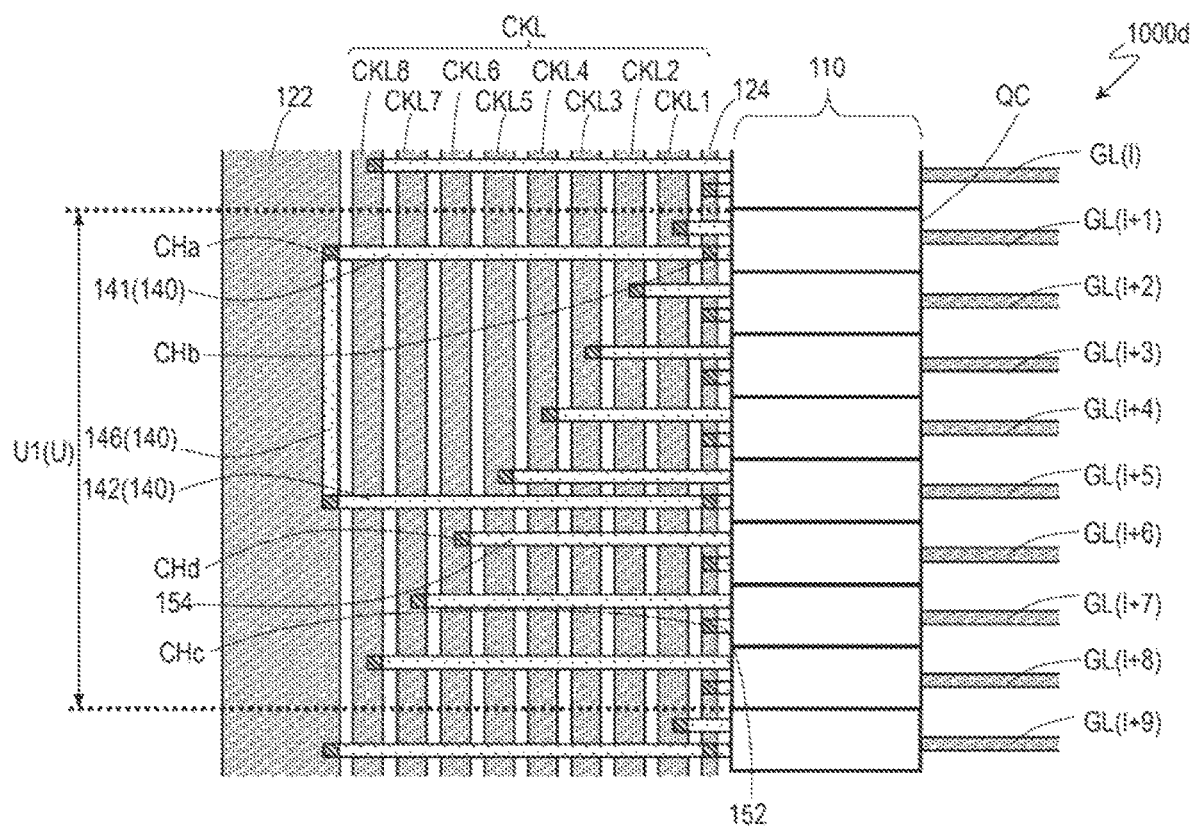
FIG. 7A is a schematic plan view of a display panel 1000d according to yet another modified example of the first embodiment, and is a plan view illustrating a region including the first unit region U1 of the first peripheral region NA1.
Figure 7B:
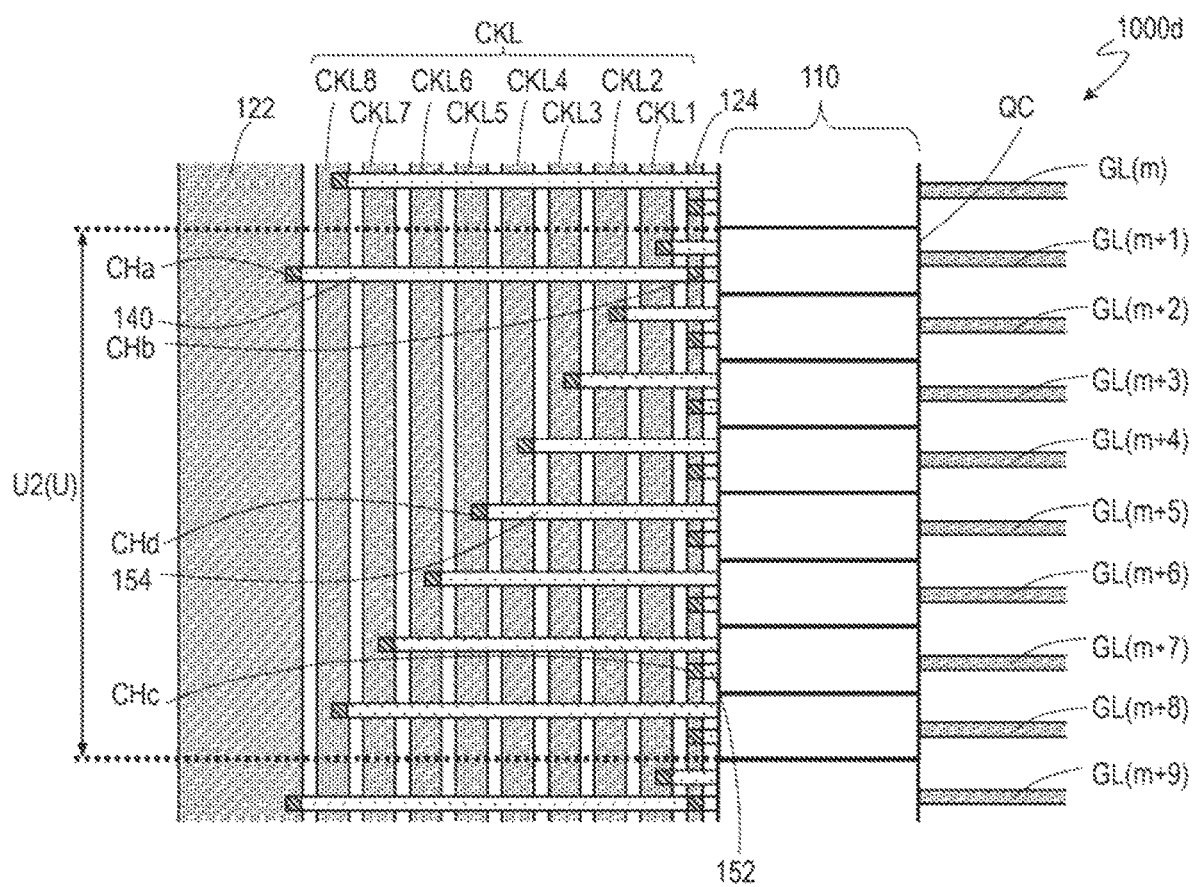
FIG. 7B is a schematic plan view of the display panel 1000d, and is a plan view illustrating a region including the second unit region U2 of the first peripheral region NA1.

FIG. 7A and FIG. 7B illustrate a display panel 1000*d* according to yet another modified example of the present embodiment. FIG. 7A illustrates the first unit region U1, and FIG. 7B illustrates the second unit region U2.

In the display panel 1000*d*, the first unit region U1 is provided with two branch wiring lines 141 and 142 extending in the row direction, and a contact branch wiring line 146 extending in the column direction and electrically connecting the two branch wiring lines 141 and 142 to each other. The branch wiring line 140 provided in the first unit region U1 includes the two branch wiring lines 141 and 142 and the contact branch wiring line 146. In contrast, only one branch wiring line 140 extending in the row direction is provided in the second unit region U2. Thus, the resistance value of the branch wiring line 140 between the outer main line 122 and the inner main line 124 for each unit region U in the first unit region U1 is smaller than that in the second unit region U2.

The display apparatus using the display panel 1000*d* also suppresses heat generation in the peripheral region, as with the display apparatus 1100*a*.

The examples described above can be combined as appropriate unless technical contradiction occurs.

Second Embodiment

In the display panel of the first embodiment described above, the outer main line 122 and the inner main line 124 are provided farther from the display region AA than the shift register 110, but in the present embodiment, the inner main line 124 is provided between the shift register 110 and the display region AA.

Figure 8A:
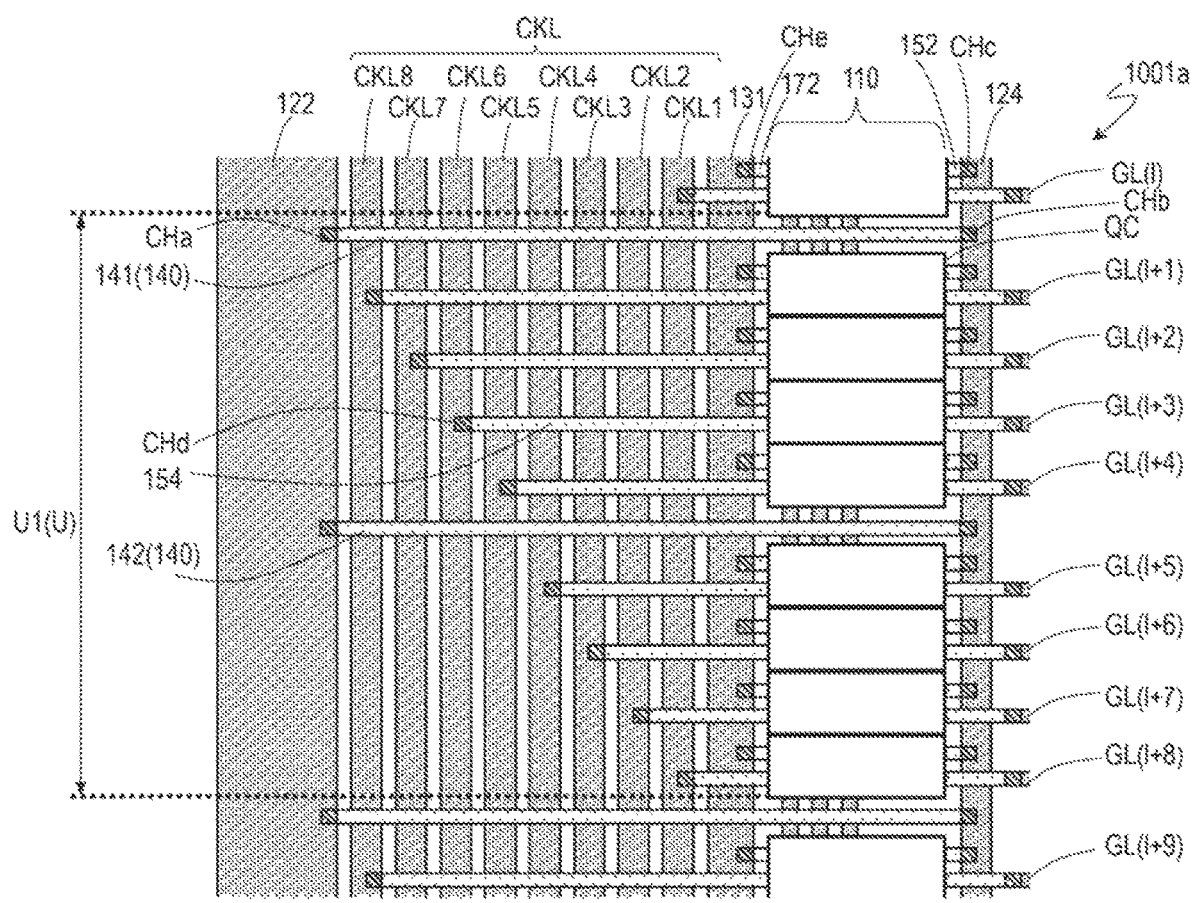
FIG. 8A is a schematic plan view of a display panel 1001a according to a second embodiment of the disclosure, and is a plan view illustrating a region including the first unit region U1 of the first peripheral region NA1.
Figure 8B:
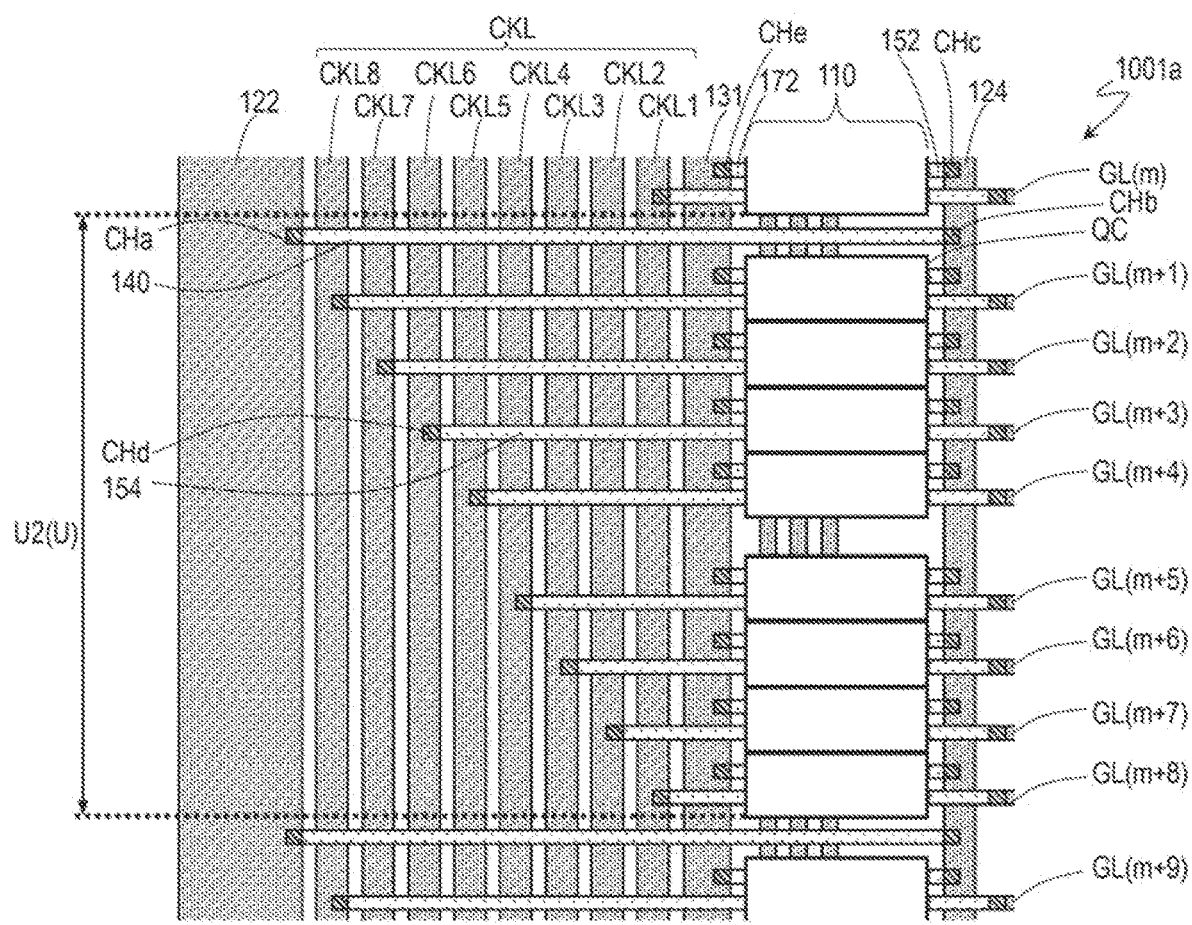
FIG. 8B is a schematic plan view of the display panel 1001a, and is a plan view illustrating a region including the second unit region U2 of the first peripheral region NA1.

A display panel 1001a according to the present embodiment will be described with reference to FIG. 8A and FIG. 8B. FIG. 8A illustrates the first unit region U1, and FIG. 8B illustrates the second unit region U2.

The display panel 1001a differs from the display panel 1000a in that the inner main line 124 is provided between the shift register 110 and the display region AA. In the display panel 1001a, then number of clock main lines CKL1 to CKLn are provided between the outer main line 122 and the shift register 110.

The display panel 1001a further includes a further main line 131 provided in the first peripheral region NA1, the further main line 131 extending in the column direction, the main line 131 being configured to supply another common signal to the plurality of stages of the shift register 110. Here, the control circuit CNTL supplies signals applying two types of low-level potentials (for example, VSS1=−12 V, VSS2=−7 V). The outer main line 122 and the inner main line 124 supply the signal applying the low-level potential VSS2 to the plurality of stages of the shift register 110, and the main line 131 supplies the signal applying the low-level potential VSS1 to the plurality of stages of the shift register 110. The main line 131 is provided between then number of clock main lines CKL1 to CKLn and the shift register 110.

In the display panel 1001a, the number of branch wiring lines 140 in the first unit region U1 is larger than the number of branch wiring lines 140 in the second unit region U2. Two branch wiring lines 140 (the branch wiring lines 141 and 142) are provided in the first unit region U1, whereas only one branch wiring line 140 is provided in the second unit region U2. Here, an interval (interval in the column direction) between the unit circuit QC and the unit circuit QC is set to be wide for each of the four unit circuits QC constituting the four consecutive stages of the shift register 110 for a space where the two branch wiring lines 140 are provided in the first unit region U1. When one branch wiring line 140 is provided in each unit region U, the interval between the unit circuits QC (interval in the column direction) may be provided so as to be wide for each of the n number of unit circuits QC constituting the consecutive n number of stages of the shift register 110.

Since a resistance value of the branch wiring line 140 in the first unit region U1 is smaller than a resistance value of the branch wiring line 140 in the second unit region U2, the display panel 1001a suppresses heat generation of the branch wiring line 140 in the first unit region U1. The display apparatus using the display panel 1001a, as with the display apparatus 1100a, suppresses heat generation in the peripheral region.

Figure 9A:
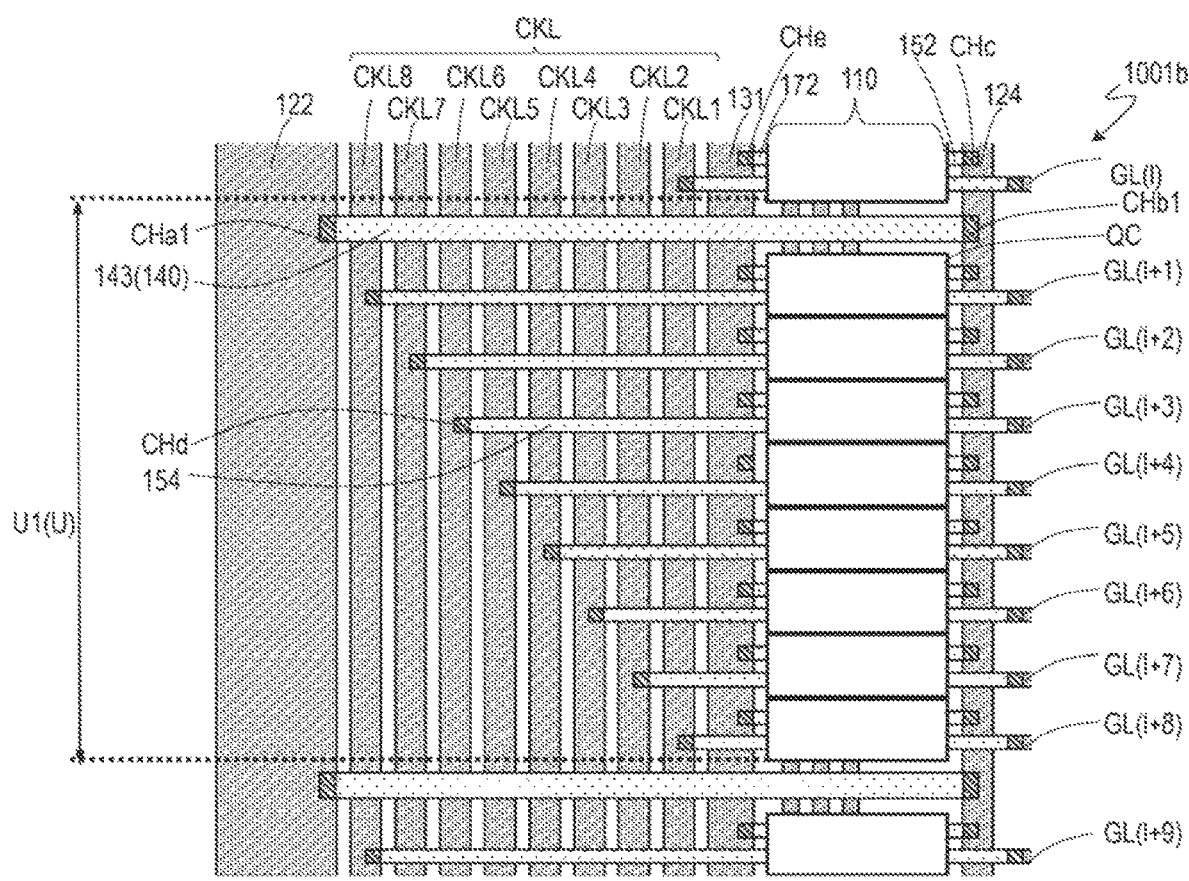
FIG. 9A is a schematic plan view of a display panel 1001b according to a modified example of the second embodiment, and is a plan view illustrating a region including the first unit region U1 of the first peripheral region NA1.
Figure 9B:
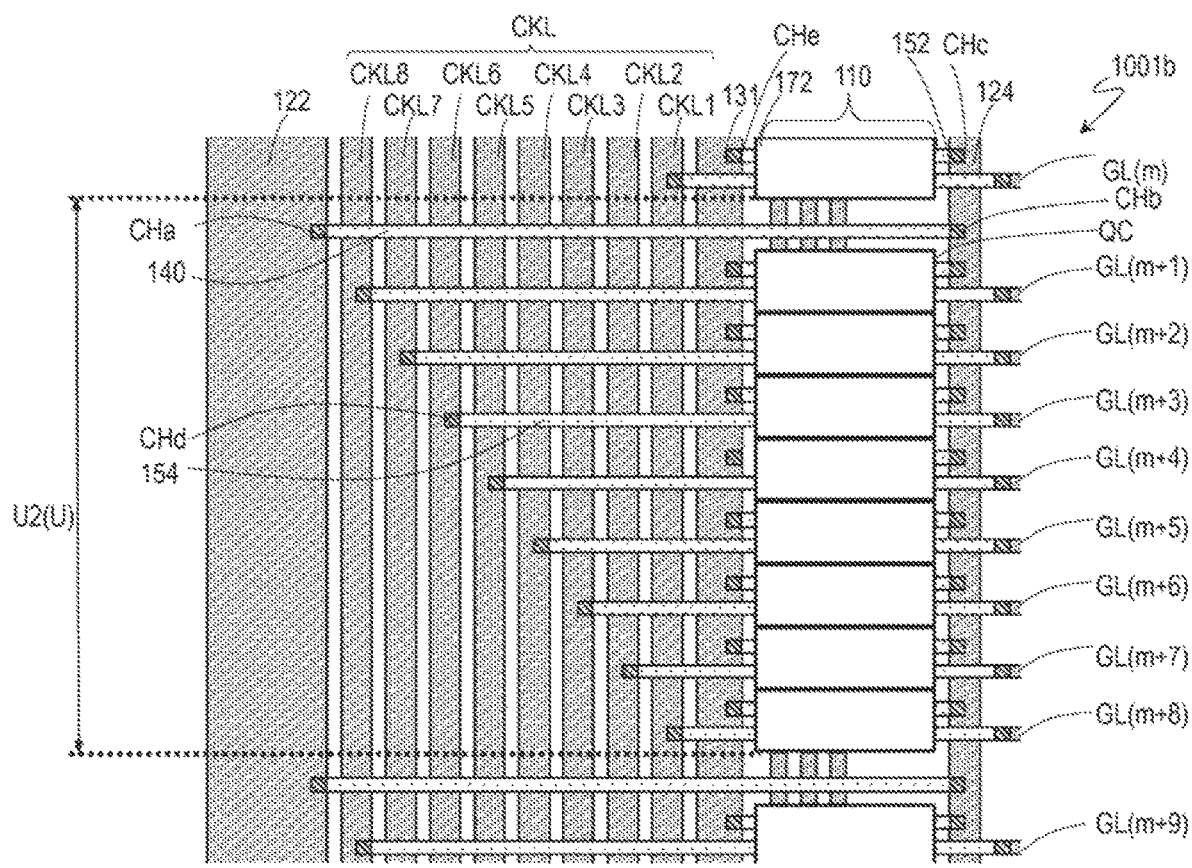
FIG. 9B is a schematic plan view of the display panel 1001b, and is a plan view illustrating a region including the second unit region U2 of the first peripheral region NA1.

A display panel 1001b according to a modified example of the present embodiment will be described with reference to FIG. 9A and FIG. 9B. FIG. 9A illustrates the first unit region U1, and FIG. 9B illustrates the second unit region U2. Differences from the display panel 1001a will be mainly described.

In the display panel 1001b, the number of branch wiring lines 140 provided in the first unit region U1 and the number of branch wiring lines 140 provided in the second unit region U2 are the same, but the width W1 in the column direction of the branch wiring line 143 provided in the first unit region U1 is larger than the width W2 in the column direction of the branch wiring line 140 provided in the second unit region U2. Thus, a resistance value of the branch wiring line 140 between the outer main line 122 and the inner main line 124 for each unit region U in the first unit region U1 is smaller than that in the second unit region U2.

Furthermore, an overlapping area of the branch wiring line 140 and the outer main line 122 in the contact hole CHa1 in the first unit region U1 may be larger than an overlapping area of the branch wiring line 140 and the outer main line 122 in the contact hole CHa in the second unit region U2. In addition, an overlapping area of the branch wiring line 140 and the inner main line 124 in the contact hole CHb1 in the first unit region U1 may be larger than an overlapping area of the branch wiring line 140 and the inner main line 124 in the contact hole CHb in the second unit region U2.

The display apparatus using the display panel 1001b also suppresses heat generation in the peripheral region, as with the display apparatus 1100a.

Figure 10A:
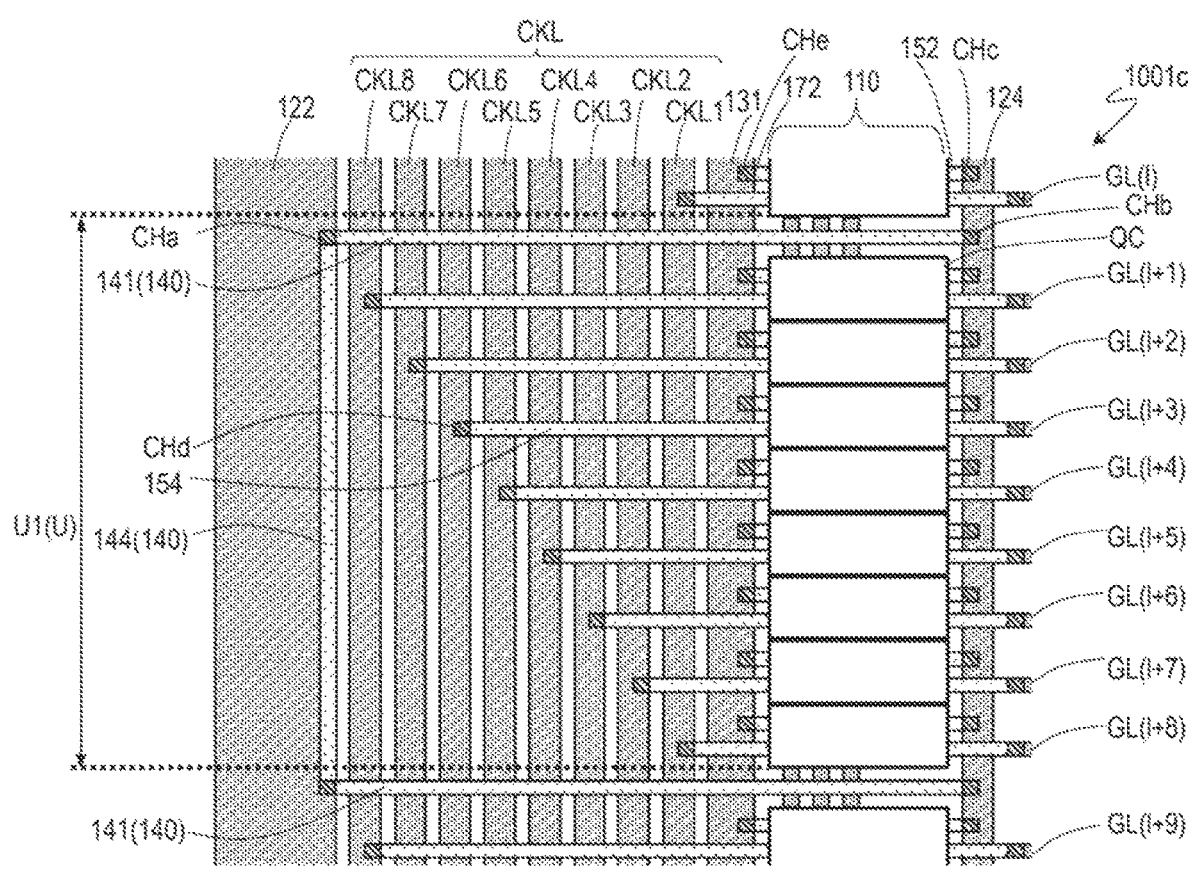
FIG. 10A is a schematic plan view of a display panel 1001c according to another modified example of the second embodiment, and is a plan view illustrating a region including the first unit region U1 of the first peripheral region NA1.
Figure 10B:
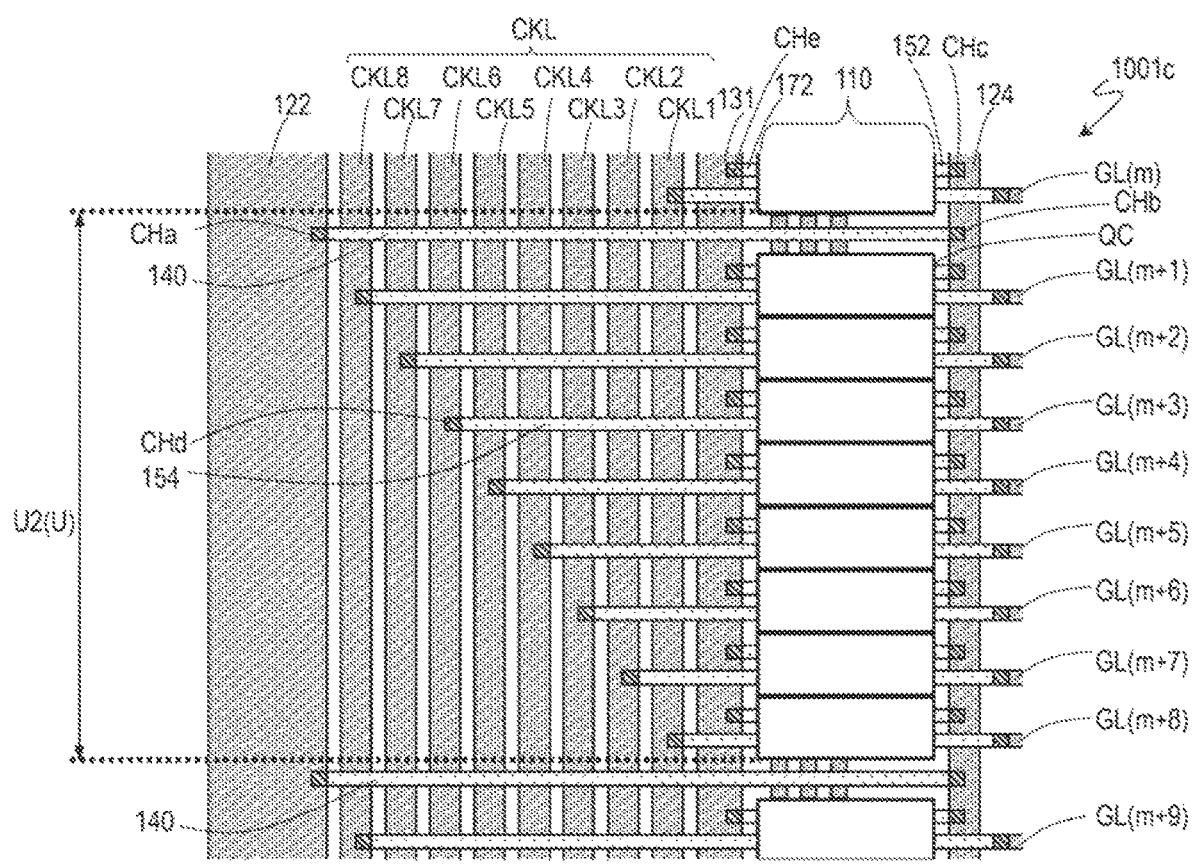
FIG. 10B is a schematic plan view of the display panel 1001c, and is a plan view illustrating a region including the second unit region U2 of the first peripheral region NA1.

Referring to FIG. 10A and FIG. 10B, a display panel 1001c according to another modified example of the present embodiment will be described. FIG. 10A illustrates the first unit region U1, and FIG. 10B illustrates the second unit region U2.

The display panel 1001c includes the branch wiring line 141 extending in the row direction and being provided in the first unit region U1, the branch wiring line 141 extending in the row direction and being provided in the unit region U adjacent to the first unit region U1 in the column direction, and the contact branch wiring line 144 extending in the column direction and electrically connecting these branch wiring lines 141. The contact branch wiring line 144 is not provided in the second unit region U2. Only the branch wiring lines 140 extending in the row direction are provided in the second unit region U2. Thus, a resistance value of the branch wiring line 140 between the outer main line 122 and the inner main line 124 for each unit region U in the first unit region U1 is smaller than that in the second unit region U2.

The display apparatus using the display panel 1001c also suppresses heat generation in the peripheral region, as with the display apparatus 1100a.

Figure 11A:
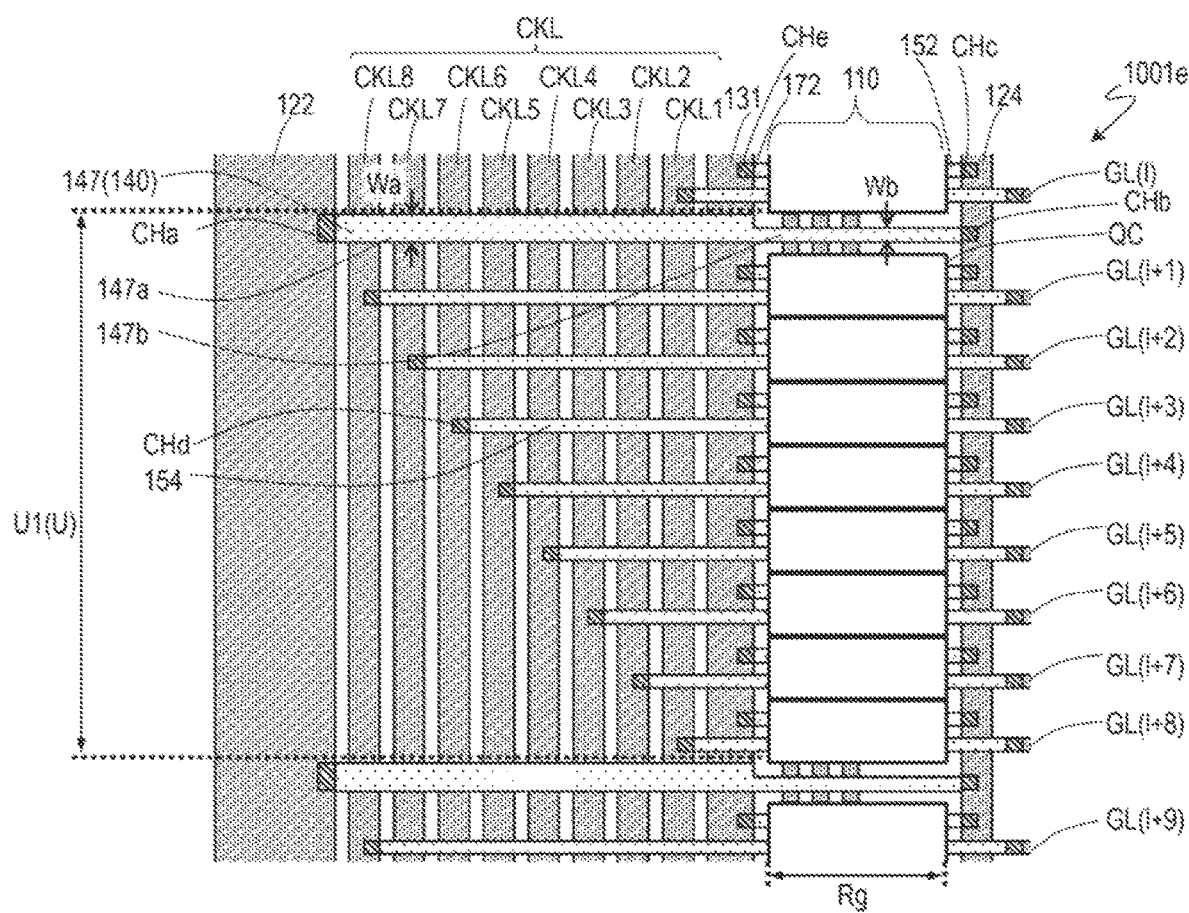
FIG. 11A is a schematic plan view of a display panel 1001e according to still another modified example of the second embodiment, and is a plan view illustrating a region including the first unit region U1 of the first peripheral region NA1.
Figure 11B:
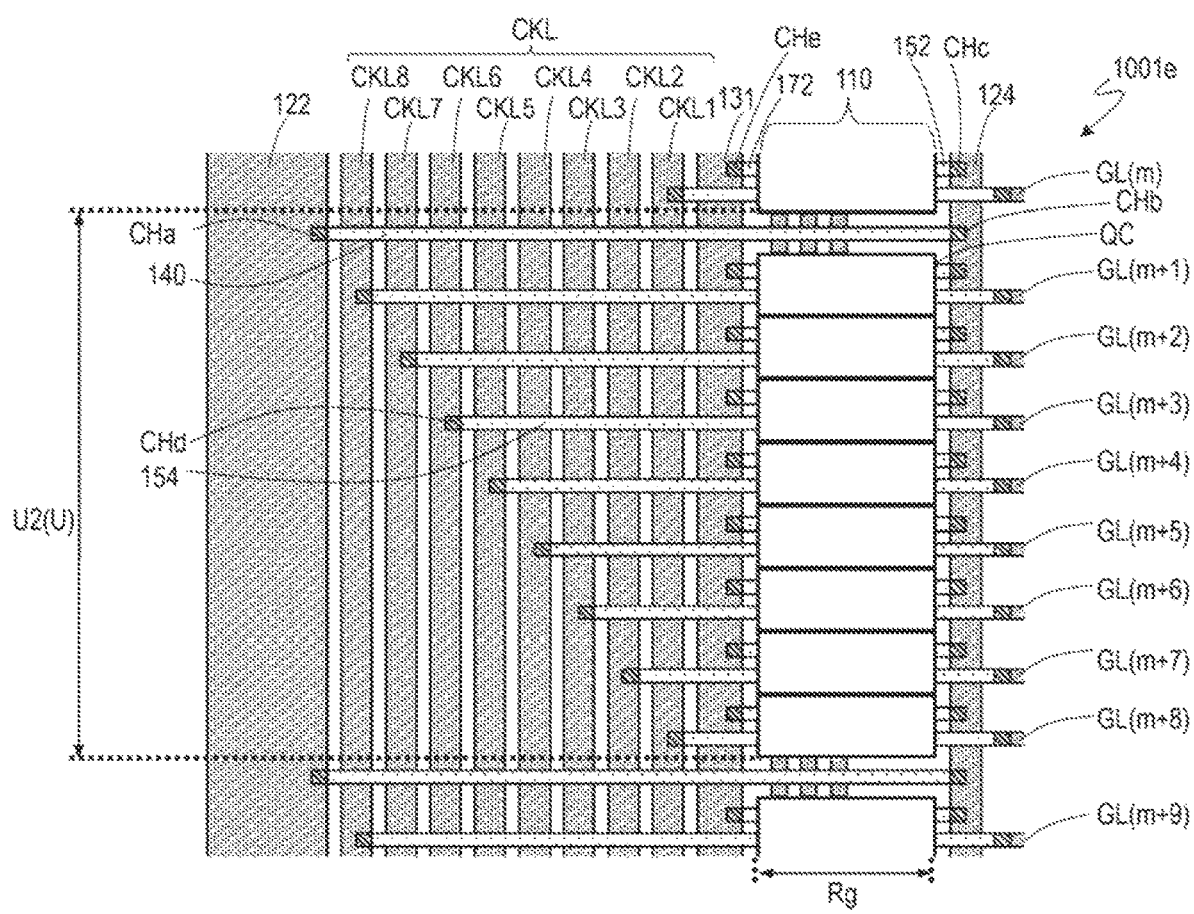
FIG. 11B is a schematic plan view of the display panel 1001e, and is a plan view illustrating a region including the second unit region U2 of the first peripheral region NA1.

Referring to FIG. 11A and FIG. 11B, a display panel 1001e according to another modified example of the present embodiment will be described. FIG. 11A illustrates the first unit region U1, and FIG. 11B illustrates the second unit region U2.

The display panel 1001e includes a branch wiring line 147 extending in the row direction and being provided in the first unit region U1. The branch wiring line 147 includes a main line intersecting section 147a that overlaps the n number of clock main lines CKL1 to CKLn, and a shift register section 147b, and a width Wa of the main line intersecting section 147a in the column direction is larger than a width Wb of the shift register section 147b in the column direction. When a region extending in the column direction and being defined by the plurality of unit circuits QC constituting the shift register 110 is referred to as a shift register region Rg, the shift register section 147b overlaps the shift register region Rg. Both edges of the shift register region Rg in the row direction (the left edge and the right edge of the figure) are determined by a left edge and a right edge of the plurality of unit circuits QC constituting the shift register 110.

The display apparatus using the display panel 1001e also suppresses heat generation in the peripheral region, as with the display apparatus 1100a, because a resistance value of the branch wiring line 140 between the outer main line 122 and the inner main line 124 for each unit region U in the first unit region U1 is smaller than that in the second unit region U2.

Since the branch wiring line 147 included in the display panel 1001e in the first unit region U1 has a small width in the column direction of the shift register section 147b overlapping the shift register region Rg, an interval (interval in the column direction) between the unit circuits QC of the shift register 110 required to provide the branch wiring line 147 can be reduced. The display panel 1001e has excellent yields because the display panel 1001e has a small area of a portion in which the branch wiring line 140 intersects another wiring line as compared to the display panel 1001b including the branch wiring line 143 having a large width in the column direction in the first unit region U1, for example, and is thereby superior in manufacturing costs.

Third Embodiment

Figure 12A:
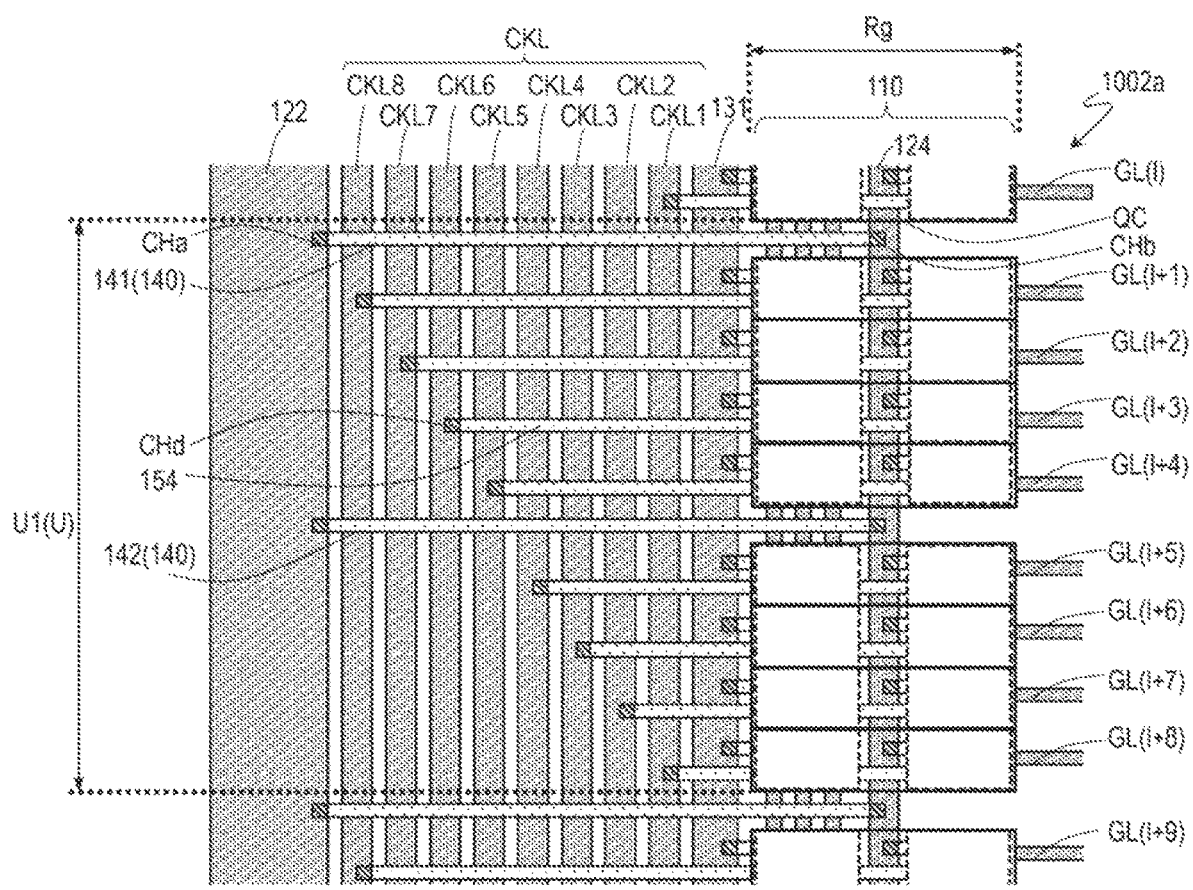
FIG. 12A is a schematic plan view of a display panel 1002a according to a third embodiment of the disclosure, and is a plan view illustrating a region including the first unit region U1 of the first peripheral region NA1.

A display panel 1002a according to the present embodiment will be described with reference to FIG. 12A, and FIG. 12B. FIG. 12A illustrates the first unit region U1, and FIG. 12B illustrates the second unit region U2.

The display panel 1002a differs from the display panel 1001a according to the second embodiment in that the inner main line 124 is disposed in a manner to overlap the shift register region Rg.

Figure 12B:
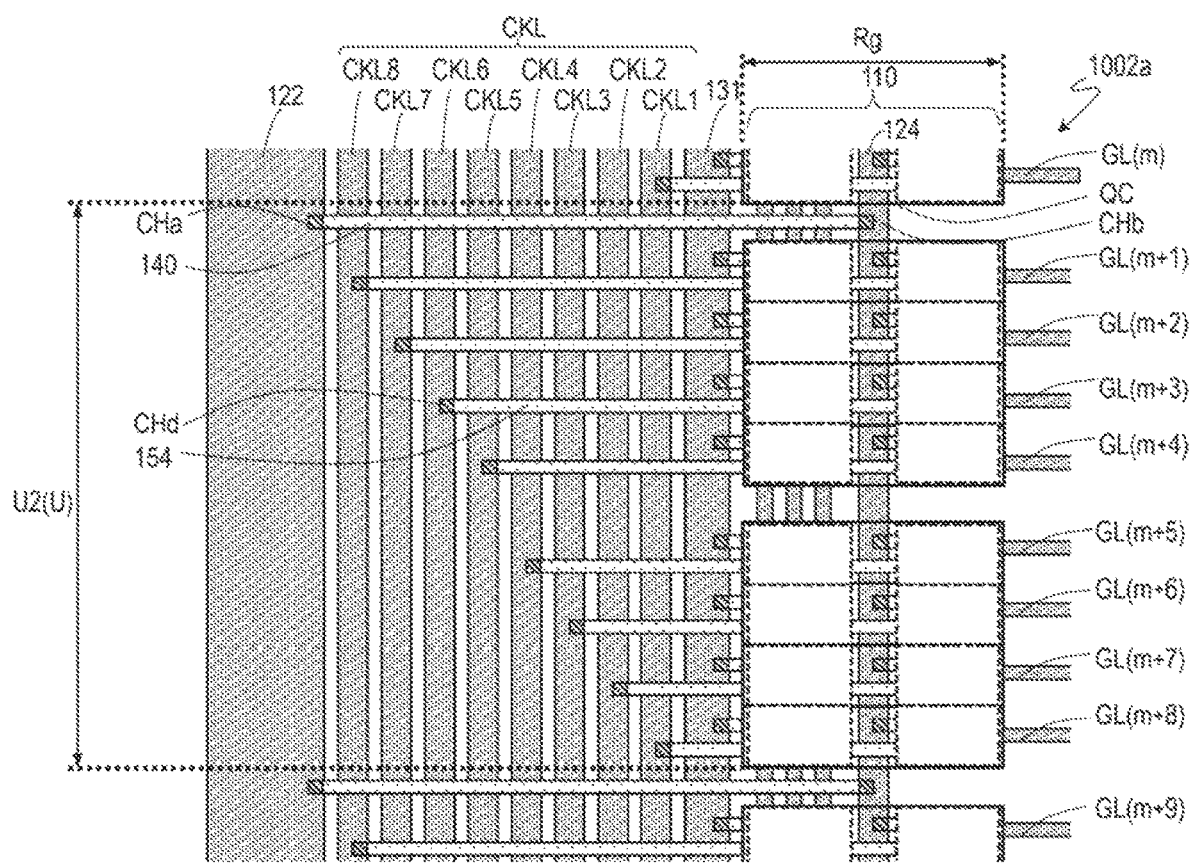
FIG. 12B is a schematic plan view of the display panel 1002a, and is a plan view illustrating a region including the second unit region U2 of the first peripheral region NA1.

In FIG. 12A and FIG. 12B, for convenience, the unit circuit QC constituting each stage of the shift register 110 is illustrated in a manner to be divided in two regions, but these are collectively referred to as a unit circuit QC. In other words, the unit circuits QC are provided individually corresponding to the plurality of stages of the shift register 110.

In the display panel 1002a, the number of branch wiring lines 140 in the first unit region U1 is larger than the number of branch wiring lines 140 in the second unit region U2. Two branch wiring lines 140 (the branch wiring lines 141 and 142) are provided in the first unit region U1, whereas only one branch wiring line 140 is provided in the second unit region U2.

Since a resistance value of the branch wiring line 140 in the first unit region U1 is smaller than a resistance value of the branch wiring line 140 in the second unit region U2, the display panel 1002a suppresses heat generation of the branch wiring line 140 in the first unit region U1. The display apparatus using the display panel 1002a also suppresses heat generation in the peripheral region, as with the display apparatus 1100a.

Figure 13A:
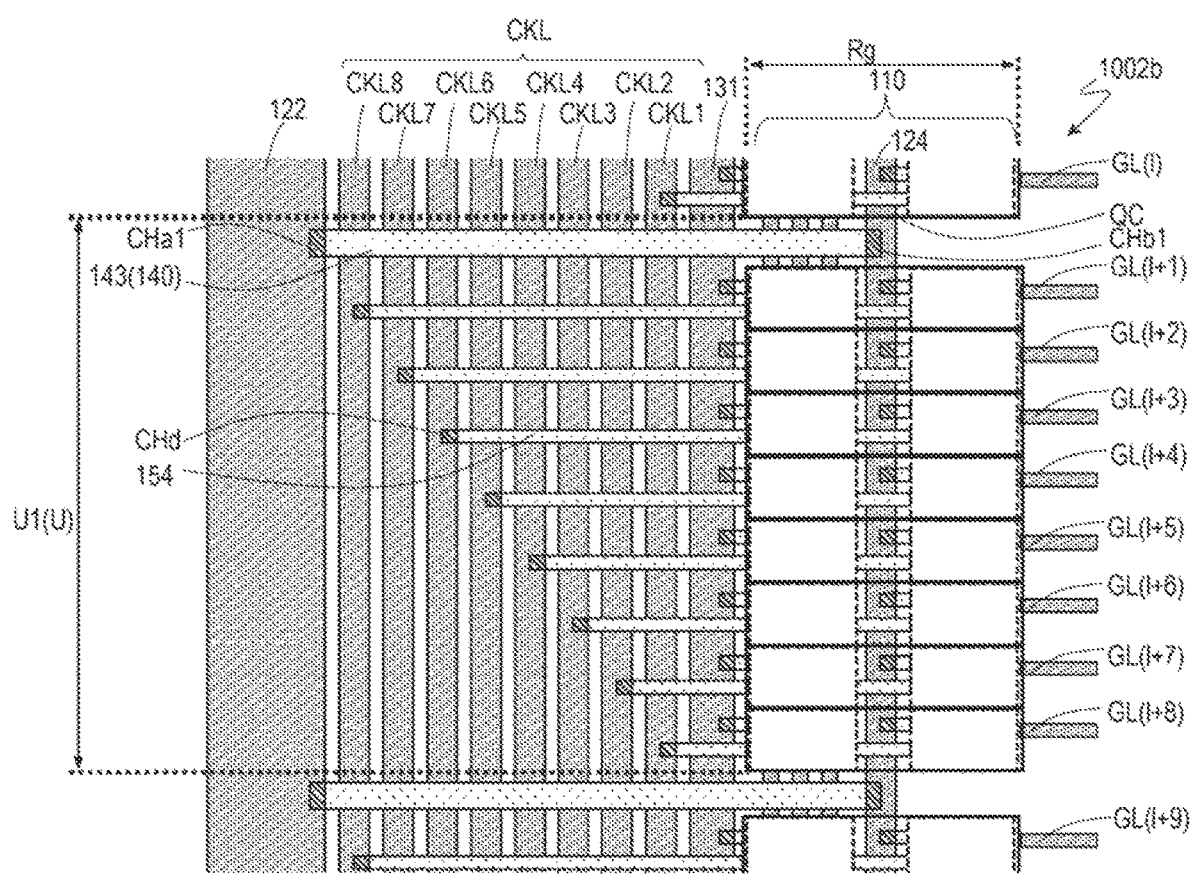
FIG. 13A is a schematic plan view of a display panel 1002b according to a modified example of the third embodiment, and is a plan view illustrating a region including the first unit region U1 of the first peripheral region NA1.
Figure 13B:
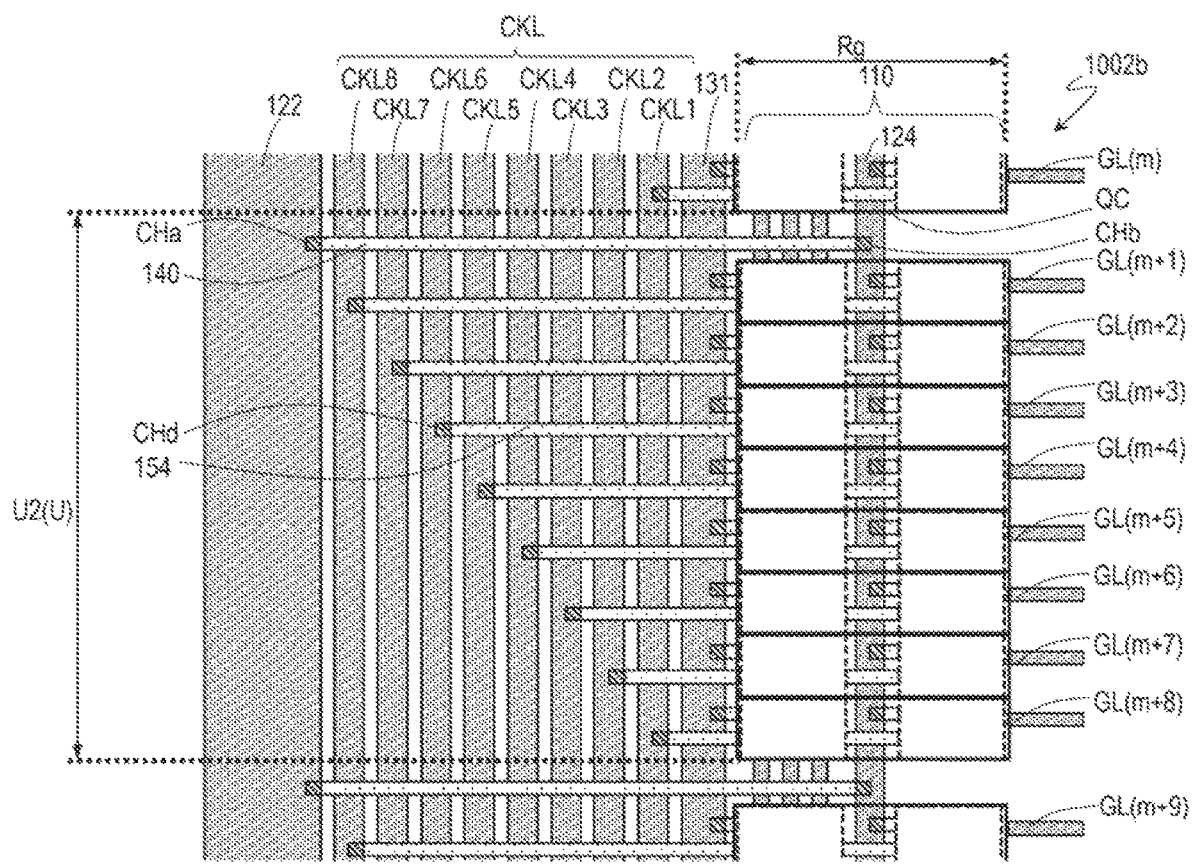
FIG. 13B is a schematic plan view of the display panel 1002b, and is a plan view illustrating a region including the second unit region U2 of the first peripheral region NA1.

Next, a display panel 1002b according to a modified example of the present embodiment will be described with reference to FIG. 13A and FIG. 13B. FIG. 13A illustrates the first unit region U1, and FIG. 13B illustrates the second unit region U2. Differences from the display panel 1002a will be mainly described.

In the display panel 1002b, the number of branch wiring lines 140 provided in the first unit region U1 and the number of branch wiring lines 140 provided in the second unit region U2 are the same, but the width W1 in the column direction of the branch wiring line 143 provided in the first unit region U1 is larger than the width W2 in the column direction of the branch wiring line 140 provided in the second unit region U2. Thus, a resistance value of the branch wiring line 140 between the outer main line 122 and the inner main line 124 for each unit region U in the first unit region U1 is smaller than that in the second unit region U2.

Furthermore, an overlapping area of the branch wiring line 140 and the outer main line 122 in the contact hole CHa1 in the first unit region U1 may be larger than an overlapping area of the branch wiring line 140 and the outer main line 122 in the contact hole CHa in the second unit region U2. In addition, an overlapping area of the branch wiring line 140 and the inner main line 124 in the contact hole CHb1 in the first unit region U1 may be larger than an overlapping area of the branch wiring line 140 and the inner main line 124 in the contact hole CHb in the second unit region U2.

The display apparatus using the display panel 1002b also suppresses heat generation in the peripheral region, as with the display apparatus 1100a.

Figure 14A:
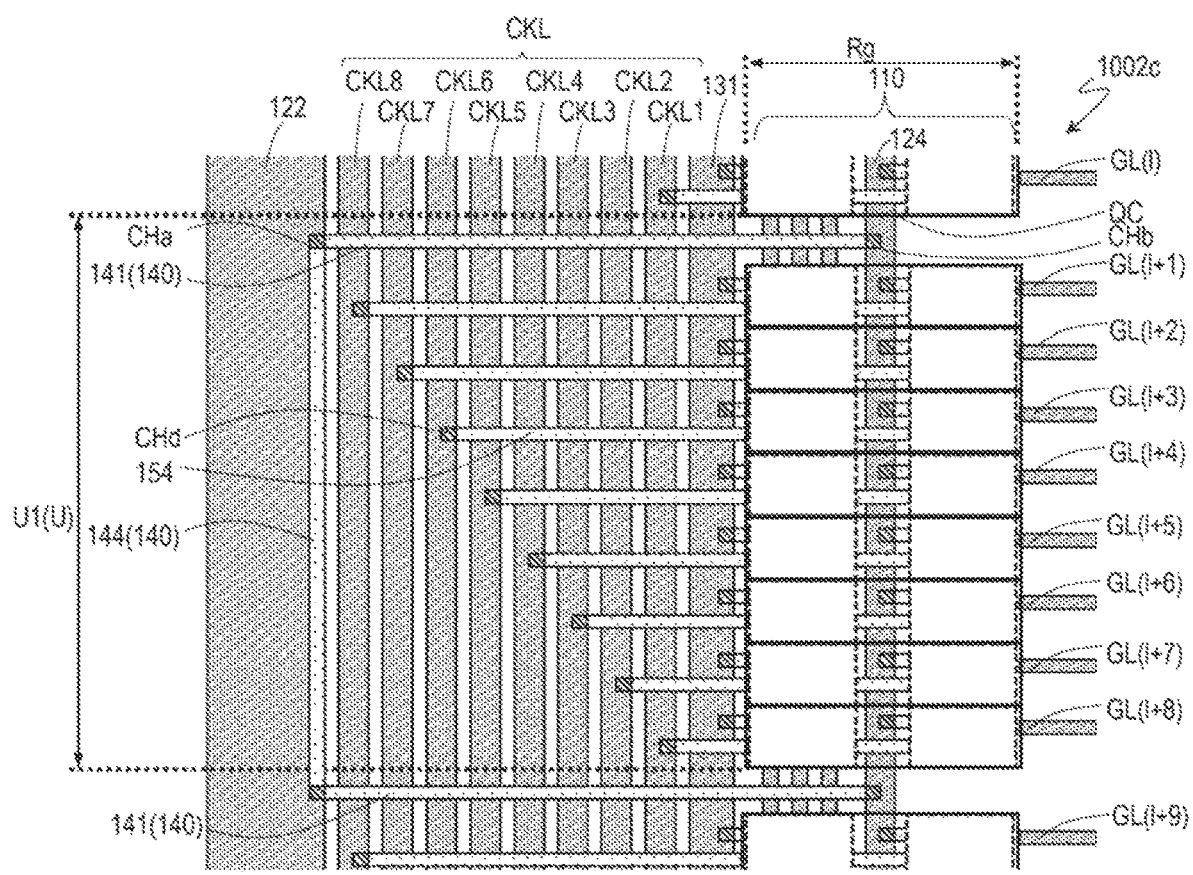
FIG. 14A is a schematic plan view of a display panel 1002c according to another modified example of the third embodiment, and is a plan view illustrating a region including the first unit region U1 of the first peripheral region NA1.
Figure 14B:
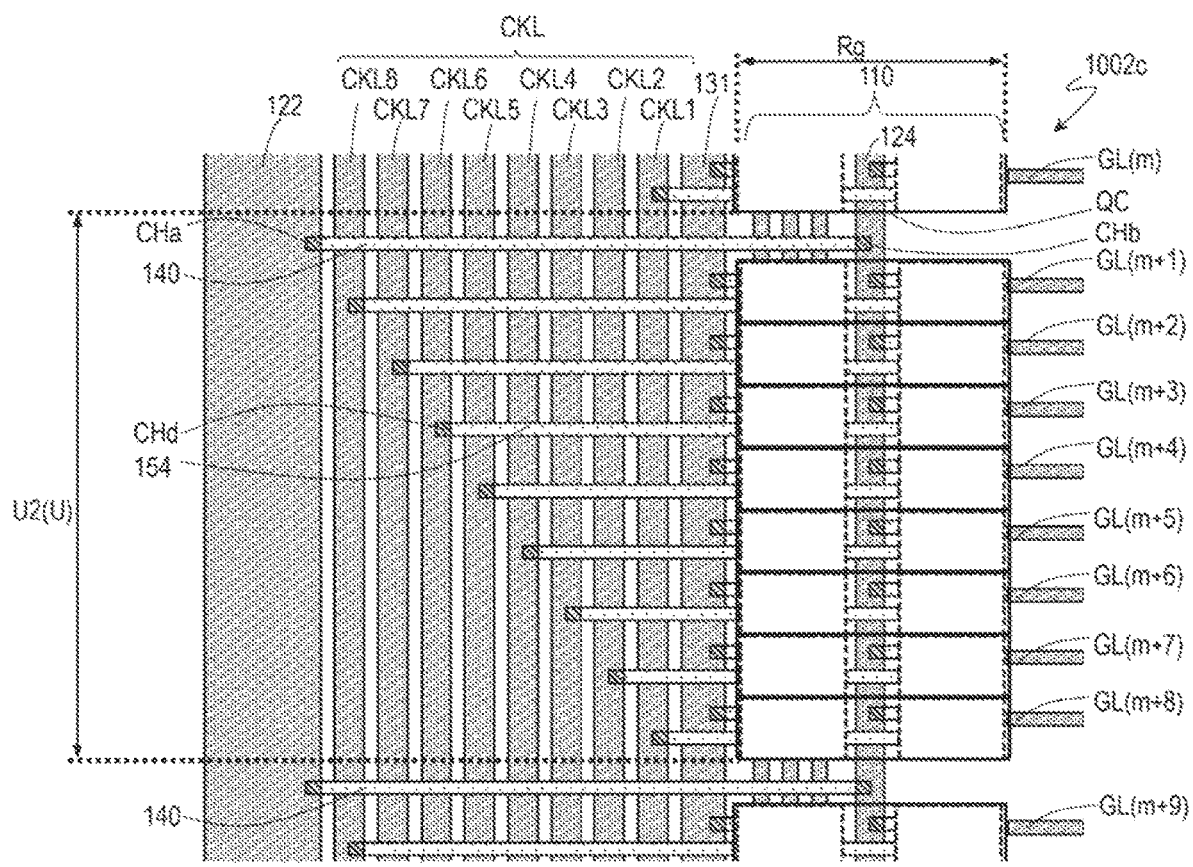
FIG. 14B is a schematic plan view of the display panel 1002c, and is a plan view illustrating a region including the second unit region U2 of the first peripheral region NA1.

Referring to FIG. 14A and FIG. 14B, a display panel 1002c according to another modified example of the present embodiment will be described. FIG. 14A illustrates the first unit region U1, and FIG. 14B illustrates the second unit region U2.

The display panel 1002c includes the branch wiring line 141 extending in the row direction and being provided in the first unit region U1, the branch wiring line 141 extending in the row direction and being provided in the unit region U adjacent to the first unit region U1 in the column direction, and the contact branch wiring line 144 extending in the column direction and electrically connecting these branch wiring lines 141. The contact branch wiring line 144 is not provided in the second unit region U2. Only the branch wiring lines 140 extending in the row direction are provided in the second unit region U2. Thus, a resistance value of the branch wiring line 140 between the outer main line 122 and the inner main line 124 for each unit region U in the first unit region U1 is smaller than that in the second unit region U2.

The display apparatus using the display panel 1002c also suppresses heat generation in the peripheral region, as with the display apparatus 1100a.

Figure 15A:
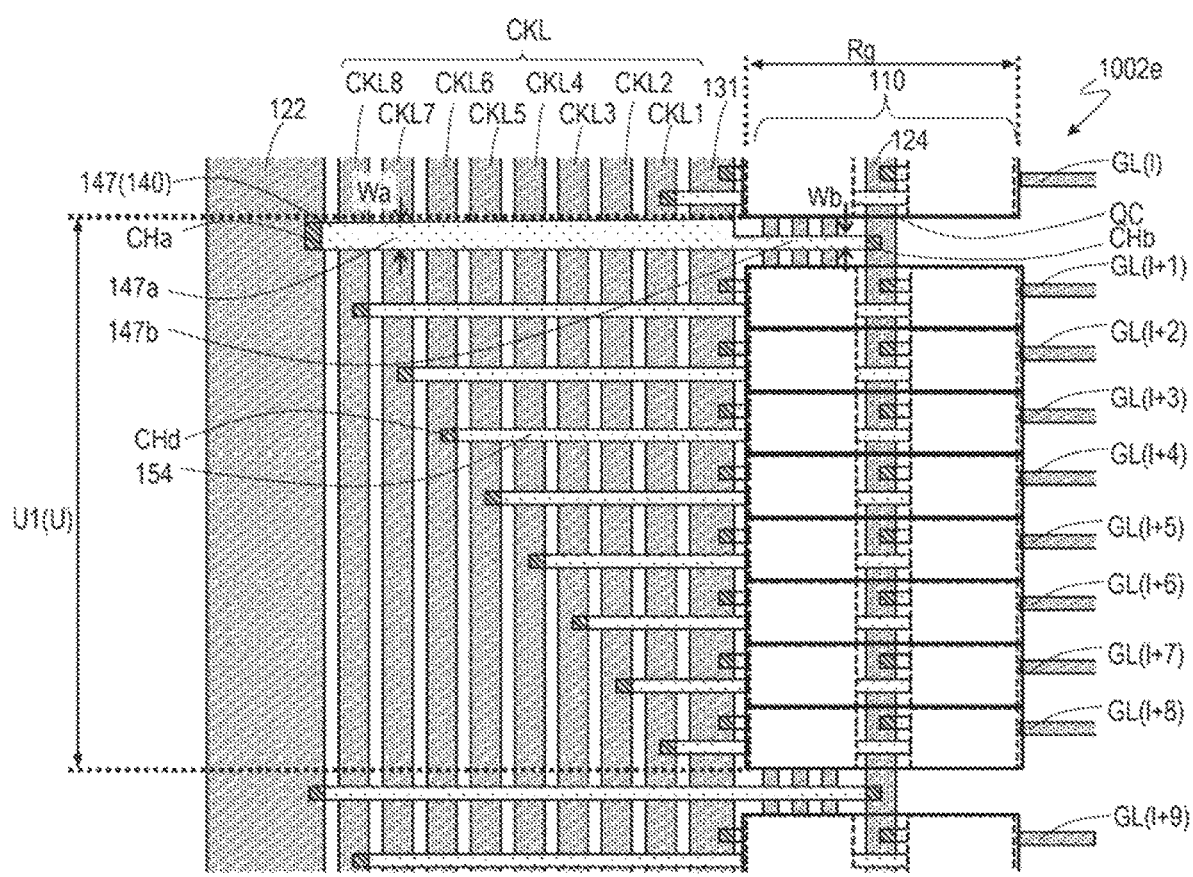
FIG. 15A is a schematic plan view of a display panel 1002e according to still another modified example of the third embodiment, and is a plan view illustrating a region including the first unit region U1 of the first peripheral region NA1.
Figure 15B:
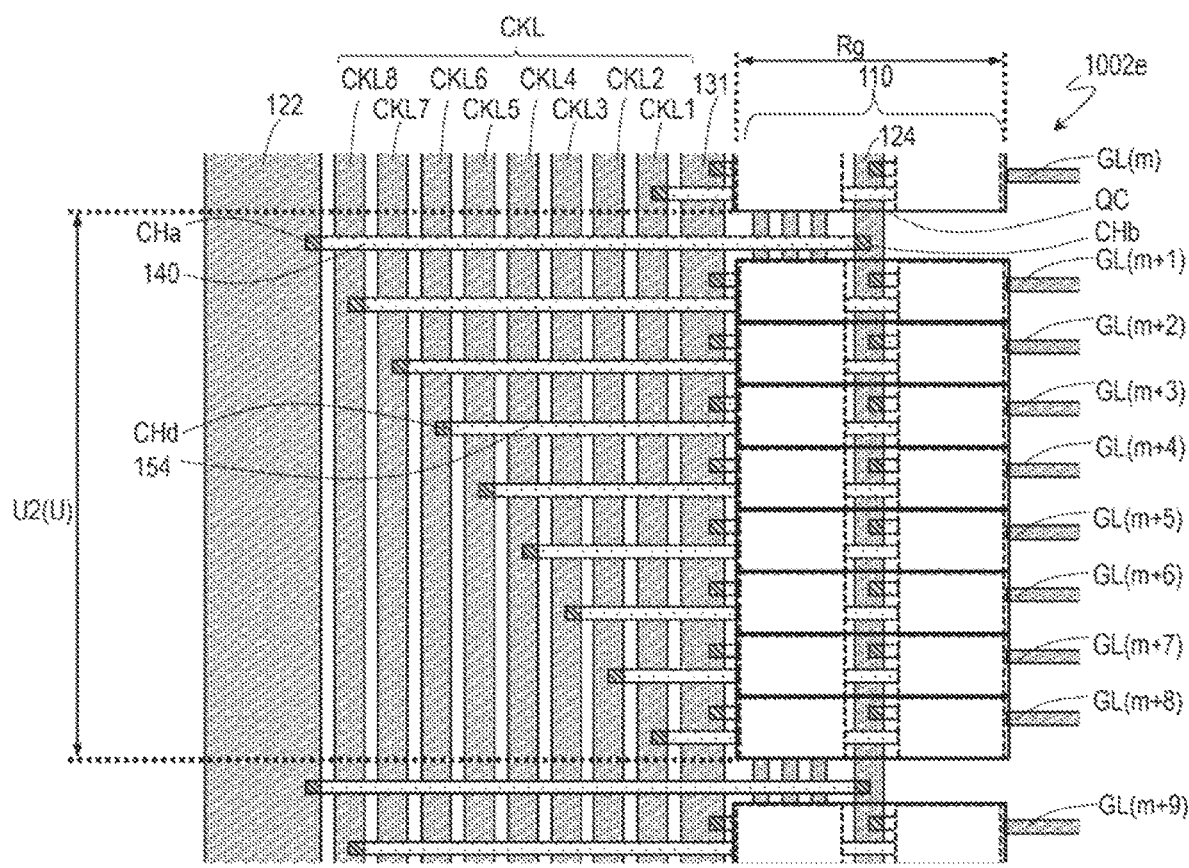
FIG. 15B is a schematic plan view of the display panel 1002e, and is a plan view illustrating a region including the second unit region U2 of the first peripheral region NA1.

Referring to FIG. 15A and FIG. 15B, a display panel 1002e according to another modified example of the present embodiment will be described. FIG. 15A illustrates the first unit region U1, and FIG. 15B illustrates the second unit region U2.

The display panel 1002e includes the branch wiring line 147 extending in the row direction and being provided in the first unit region U1. The branch wiring line 147 includes the main line intersecting section 147a that overlaps the n number of clock main lines CKL1 to CKLn and the shift register section 147b that overlaps the shift register region Rg, and the width Wa in the column direction of the main line intersecting section 147a is larger than the width Wb in the column direction of the shift register section 147b.

The display apparatus using the display panel 1002e also suppresses heat generation in the peripheral region, as with the display apparatus 1100a, because a resistance value of the branch wiring line 140 between the outer main line 122 and the inner main line 124 for each unit region U in the first unit region U1 is smaller than that in the second unit region U2.

Fourth Embodiment

Figure 16A:
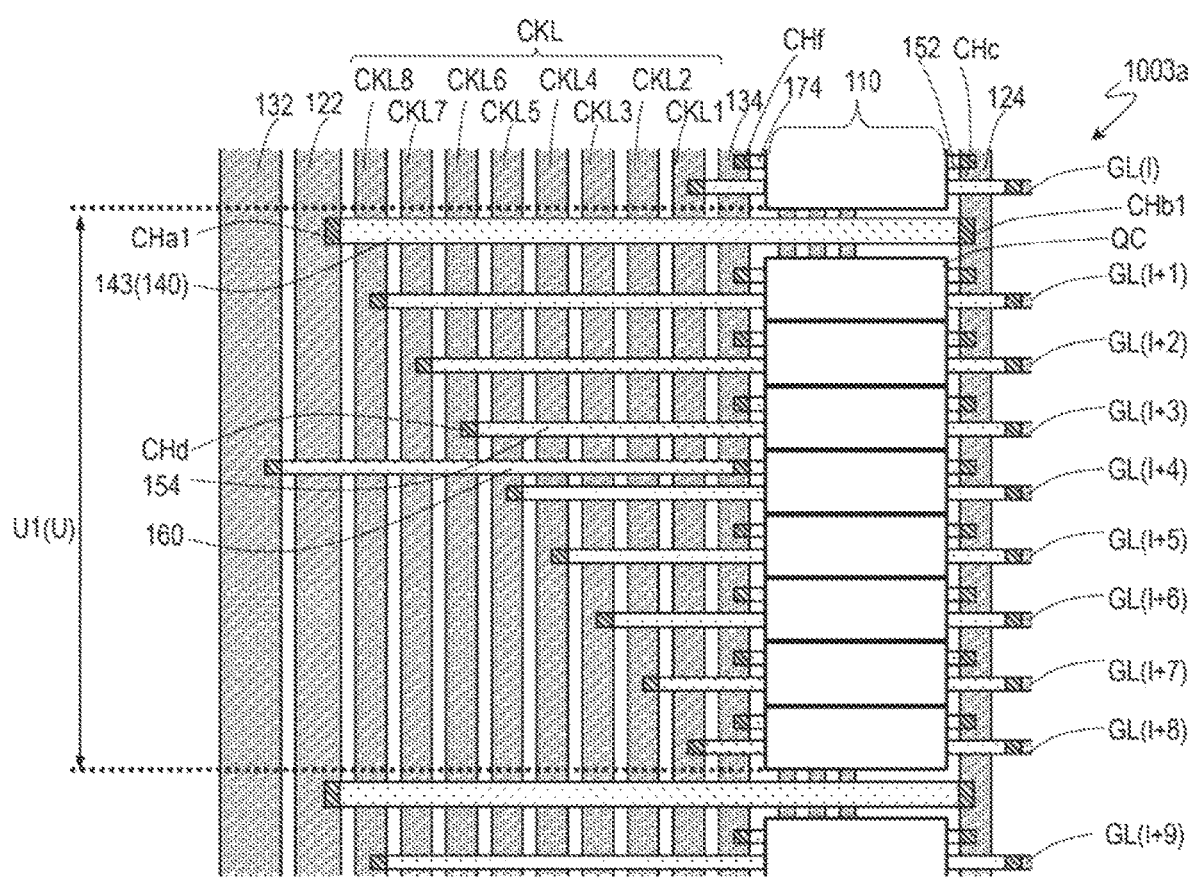
FIG. 16A is a schematic plan view of a display panel 1003a according to a fourth embodiment of the disclosure, and is a plan view illustrating a region including the first unit region U1 of the first peripheral region NA1.

A display panel 1003a according to the present embodiment will be described with reference to FIG. 16A and FIG.

Figure 16B:
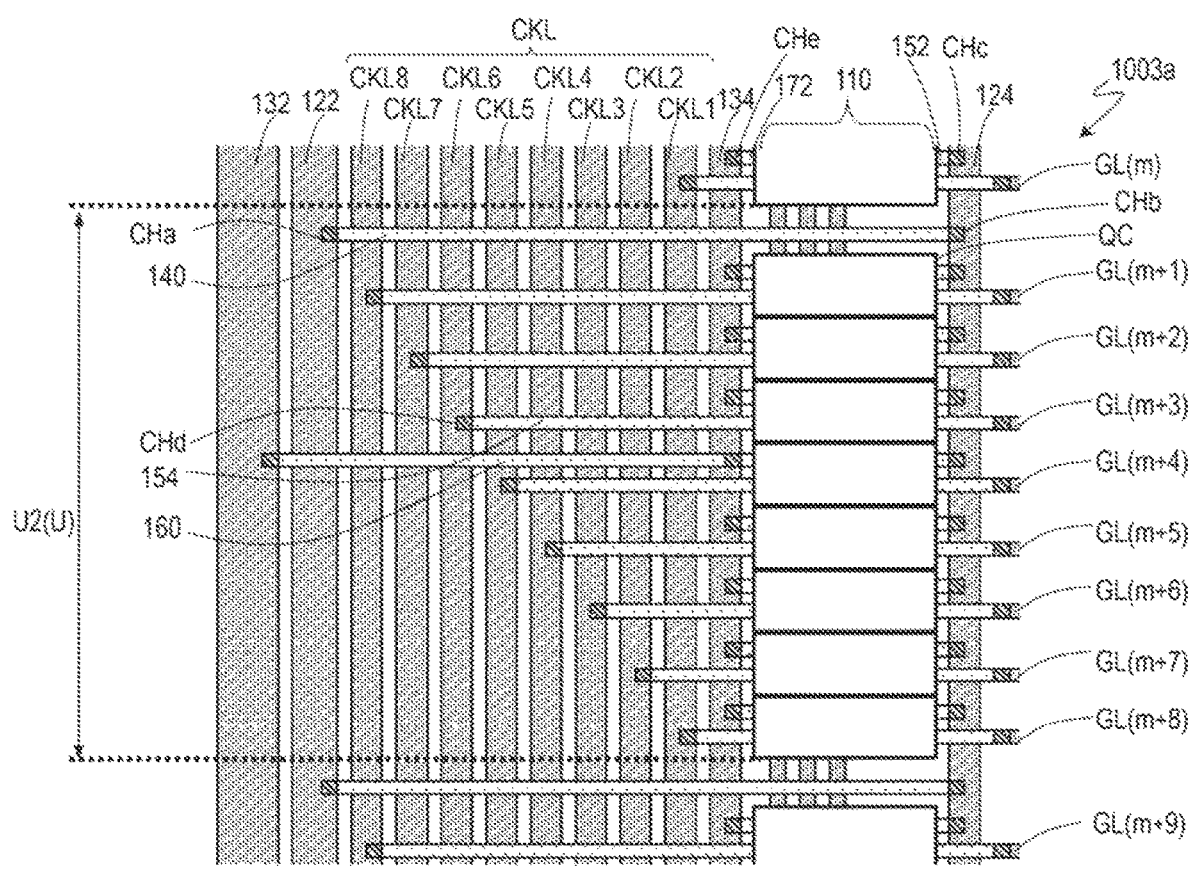
FIG. 16B is a schematic plan view of the display panel 1003a, and is a plan view illustrating a region including the second unit region U2 of the first peripheral region NA.

16B. FIG. 16A illustrates the first unit region U1, and FIG. 16B illustrates the second unit region U2.

The display panel 1003a differs from the display panel 1001a in that the display panel 1003a includes another outer main line 132 and another inner main line 134, and another plurality of branch wiring lines 160 electrically connecting the other outer main line 132 and the other inner main line 134, instead of the further main line 131 of the display panel 1001a according to the second embodiment. The outer main line 132 and the inner main line 134 are provided in the first peripheral region NA1, and each of the outer main line 132 and the inner main line 134 extends in the column direction, and supplies another common signal to the plurality of stages of the shift register 110 (for example, the signal VD that applies the high-level potential). The terminal portion TP in the second peripheral region NA2 of the display panel 1003a is further provided with a terminal electrically connected to the outer main line 132, and for example, the signal VD that applies the high-level potential is supplied from the control circuit CNTL via the terminal to the outer main line 132. The outer main line 132 and the inner main line 134 are electrically connected through the branch wiring line 160, and the inner main line 134 and an input (input terminal) of each stage of the shift register 110 are electrically connected through the wiring line 174, so that the signal VD that applies the high-level potential is supplied to the input of each stage of the shift register 110.

The display apparatus using the display panel 1003a also suppresses heat generation in the peripheral region, as with the display apparatus 1100a, a resistance value of the branch wiring line 140 between the outer main line 122 and the inner main line 124 for each unit region U in the first unit region U1 is smaller than that in the second unit region U2.

In the display panel 1003a, the resistance value of the branch wiring line 160 between the outer main line 132 and the inner main line 134 for each unit region U in the first unit region U1 is substantially equal to that in the second unit region U2.

Figure 17A:
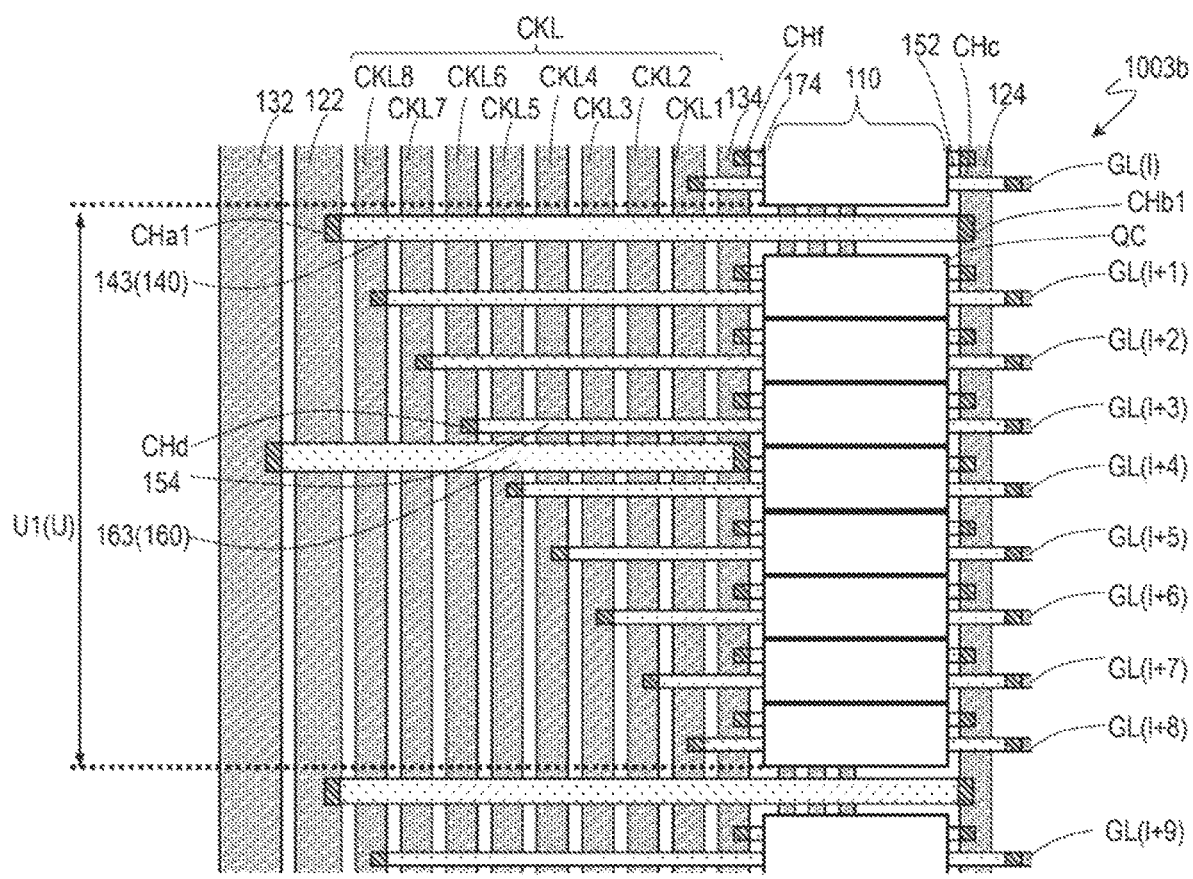
FIG. 17A is a schematic plan view of a display panel 1003b according to a modified example of the fourth embodiment, and is a plan view illustrating a region including the first unit region U1 of the first peripheral region NA1.
Figure 17B:
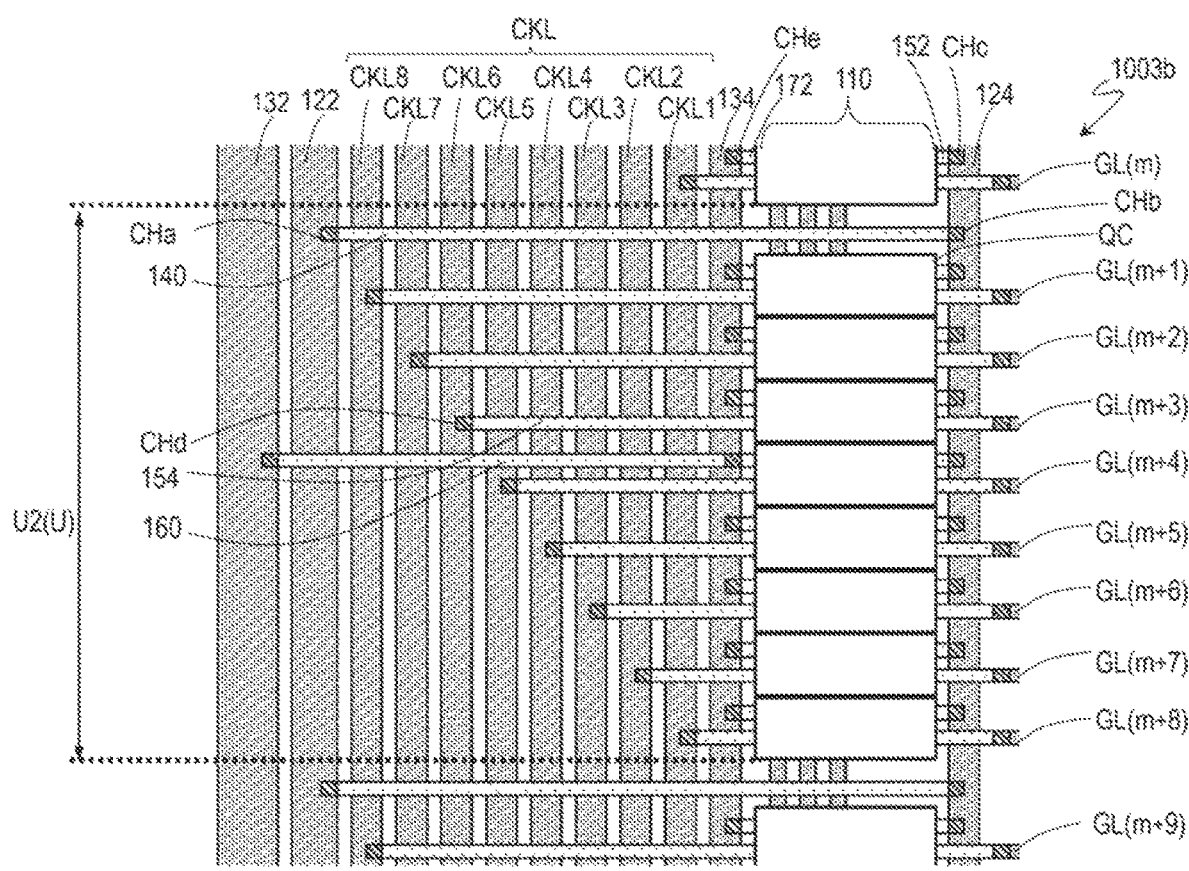
FIG. 17B is a schematic plan view of the display panel 1003b, and is a plan view illustrating a region including the second unit region U2 of the first peripheral region NA1.

A display panel 1003b according to a modified example of the present embodiment will be described with reference to FIG. 17A and FIG. 17B. FIG. 17A illustrates the first unit region U1, and FIG. 17B illustrates the second unit region U2. Differences from the display panel 1003a will be mainly described.

In the display panel 1003b, the plurality of branch wiring lines 160 include at least one branch wiring line 160 for each unit region U. A resistance value of the at least one branch wiring line 160 between the outer main line 132 and the inner main line 134 in the first unit region U1 is smaller than a resistance value of the at least one branch wiring line 160 between the outer main line 132 and the inner main line 134 in the second unit region U2. Here, a width in the column direction of the branch wiring line 163 provided in the first unit region U1 is larger than the width in the column direction of the branch wiring line 160 provided in the second unit region U2.

In the display panel 1003b, a resistance value of the branch wiring line 140 between the outer main line 122 and the inner main line 124 for each unit region U in the first unit region U1 is smaller than that in the second unit region U2. The display panel using the display panel 1003b also suppresses heat generation in the peripheral region, as with the display apparatus 1100a. Furthermore, in the display panel 1003b, the resistance value of the branch wiring line 160 between the outer main line 132 and the inner main line 134 for each unit region U in the first unit region U1 is smaller than that in the second unit region U2. As a result, in the display apparatus using the display panel 1003b, an effect of suppressing heat generation in the peripheral region is larger than that of the display apparatus using the display panel 1003a.

Note that, in addition to the illustrated example, any of the above-described methods of making the resistance value of the branch wiring line 140 between the outer main line 122 and the inner main line 124 for each unit region U in the first unit region U1 smaller than that in the second unit region U2 may be adopted for a method of making the resistance value of the branch wiring line 160 between the outer main line 132 and the inner main line 134 for each unit region U in the first unit region U1 smaller than that in the second unit region U2.

The display apparatuses according to the embodiments of the disclosure can suppress heat generation in the peripheral region. The display apparatuses and the display panels according to the embodiments of the disclosure are suitably used for, for example, large display apparatuses.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display apparatus including a plurality of pixels arrayed in a matrix including a plurality of pixel rows and a plurality of pixel columns, the display apparatus comprising:
   a display panel including a display region defined by the plurality of pixels, a first peripheral region adjacent to the display region in a row direction, and a second peripheral region adjacent to the display region in a column direction; and
   a circuit substrate connected to a terminal portion provided in the second peripheral region of the display panel,
   wherein the display panel includes
   a gate drive circuit provided in the first peripheral region, the gate drive circuit including a shift register, the shift register including a plurality of stages individually corresponding to the plurality of pixel rows,
   n number of clock main lines provided in the first peripheral region, where n is an integer being equal to or larger than 2, each of the n number of clock main lines extending in the column direction, the n number of clock main lines being configured to supply n number of types of clock signals having different phases from one another to the plurality of stages included in the shift register,
   an outer main line and an inner main line provided in the first peripheral region, each of the outer main line and the inner main line extending in the column direction, and the outer main line and the inner main line being configured to supply a common signal to the plurality of stages included in the shift register, and
   a plurality of branch wiring lines provided in the first peripheral region, each of the plurality of branch wiring lines electrically connecting the outer main line and the inner main line,
   the circuit substrate includes a control circuit configured to supply a control signal to the gate drive circuit,
   the first peripheral region includes a plurality of unit regions arrayed in the column direction, the plurality of unit regions individually corresponding to the n number of stages included in the shift register, the n number of stages being configured to be supplied with the n number of types of clock signals having the different phases from one another from the n number of clock main lines, the plurality of branch wiring lines include at least one branch wiring line for each unit region, and the plurality of unit regions includes a first unit region and a second unit region, the first unit region being disposed closer to the terminal portion than the second unit region, a resistance value of the at least one branch wiring line between the inner main line and the outer main line in the first unit region being smaller than a resistance value of the at least one branch wiring line between the inner main line and the outer main line in the second unit region.

2. The display apparatus according to claim 1, wherein a total area of the at least one branch wiring line in the first unit region is larger than a total area of the at least one branch wiring line in the second unit region.

3. The display apparatus according to claim 1, wherein the number of the branch wiring lines being the at least one branch wiring line in the first unit region is larger than the number of the branch wiring lines being the at least one branch wiring line in the second unit region.

4. The display apparatus according to claim 1, wherein the plurality of branch wiring lines include a first branch wiring line provided in the first unit region, the first branch wiring line extending in the row direction, and a second branch wiring line provided in the second unit region, the second branch wiring line extending in the row direction, and the first branch wiring line is larger in width in the column direction than the second branch wiring line.

5. The display apparatus according to claim 1, further comprising:

a first conductive layer including the outer main line and the inner main line;

a second conductive layer including the plurality of branch wiring lines; and an insulating layer provided between the first conductive layer and the second conductive layer, wherein the insulating layer includes a plurality of first contact holes each connecting a corresponding one of the plurality of branch wiring lines and the outer main line, and a plurality of second contact holes connecting a corresponding one of the plurality of branch wiring lines and the inner main line, and an overlapping area of the at least one branch wiring line and the outer main line in a corresponding one of the plurality of first contact holes, in the first unit region is larger than an overlapping area of the at least one branch wiring line and the outer main line in the corresponding one of the plurality of first contact holes, in the second contact hole.

6. The display apparatus according to claim 5, wherein an overlapping area of the at least one branch wiring line and the inner main line in the corresponding one of the plurality of second contact holes, in the first unit region is larger than an overlapping area of the at least one branch wiring line and the inner main line in the corresponding one of the plurality of second contact holes, in the second unit region.

7. The display apparatus according to claim 1, wherein the plurality of branch wiring lines include a branch wiring line extending in the row direction, the branch wiring line being provided in the first unit region, an adjacent branch wiring line extending in the row direction, the adjacent branch wiring line being provided in a unit region adjacent to the first unit region in the column direction, of the plurality of unit regions, and a contact branch wiring line extending in the column direction, the contact branch wiring line electrically connecting the branch wiring line and the adjacent branch wiring line.

8. The display apparatus according to claim 1, wherein the plurality of branch wiring lines include two branch wiring lines extending in the row direction, the two branch wiring lines being provided in the first unit region, and a contact branch wiring line extending in the column direction, the contact branch wiring line being provided in the first unit region, the contact branch wiring line electrically connecting the two branch wiring lines to each other.

9. The display apparatus according to claim 1, wherein the outer main line and the inner main line are disposed farther from the display region than the shift register.

10. The display apparatus according to claim 9, wherein the n number of clock main lines are provided between the outer main line and the inner main line.

11. The display apparatus according to claim 1, wherein the outer main line is disposed farther from the display region than the shift register, and the inner main line is provided between the shift register and the display region.

12. The display apparatus according to claim 11, wherein the n number of clock main lines are provided between the outer main line and the shift register.

13. The display apparatus according to claim 11, further comprising:

a further main line provided in the first peripheral region, the further main line extending in the column direction, the further main line being configured to supply another common signal to the plurality of stages of the shift register, wherein the further main line is provided between the n number of clock main lines and the shift register.

14. The display apparatus according to claim 11, wherein the at least one branch wiring line in the first unit region includes a branch wiring line extending in the row direction, the branch wiring line including a main line intersecting section overlapping the n number of clock main lines, and a shift register section overlapping a region extending in the column direction, the region being defined by the plurality of unit circuits constituting the shift register, a width of the main line intersecting section in the column direction being larger than a width of the shift register section in the column direction.

15. The display apparatus according to claim 1, wherein the outer main line is disposed farther from the display region than the shift register, and the inner main line overlaps a region extending in the column direction, the region being defined by the plurality of unit circuits constituting the shift register.

16. The display apparatus according to claim 1,
wherein the common signal is a signal configured to provide a low-level potential or a signal configured to provide a high-level potential.

17. The display apparatus according to claim 1, further comprising:
another outer main line and another inner main line provided in the first peripheral region, each of the other outer main line and the other inner main line extending in the column direction, the other outer main line and the other inner main line being configured to supply another common signal to the plurality of stages of the shift register; and
another plurality of branch wiring lines provided in the first peripheral region, each of the other plurality of branch wiring lines electrically connecting the other outer main line and the other inner main line.

18. The display apparatus according to claim 17,
wherein the other plurality of branch wiring lines include at least one other branch wiring line for each unit region, and
a resistance value of the at least one other branch wiring line between the other outer main line and the other inner main line in the first unit region is smaller than a resistance value of the at least one other branch wiring line between the other outer main line and the other inner main line in the second unit region.

19. A display panel including a plurality of pixels arrayed in a matrix including a plurality of pixel rows and a plurality of pixel columns, a display region defined by the plurality of pixels, a first peripheral region adjacent to the display region in a row direction, and a second peripheral region adjacent to the display region in a column direction, the display panel comprising:
a gate drive circuit provided in the first peripheral region, the gate drive circuit including a shift register, the shift register including a plurality of stages individually corresponding to the plurality of pixel rows;
n number of clock main lines provided in the first peripheral region, where n is an integer being equal to or larger than 2, each of the n number of clock main lines extending in the column direction, the n number of clock main lines being configured to supply n number of types of clock signals having different phases from one another to the plurality of stages included in the shift register;
an outer main line and an inner main line provided in the first peripheral region, each of the outer main line and the inner main line extending in the column direction, the outer main line and the inner main line being configured to supply a common signal to the plurality of stages included in the shift register; and
a plurality of branch wiring lines provided in the first peripheral region, each of the plurality of branch wiring lines electrically connecting the outer main line and the inner main line,
wherein the second peripheral region includes a terminal portion including an outer main line terminal electrically connected to the outer main line, and n number of clock main line terminals individually electrically connected to the n number of clock main lines,
the first peripheral region includes a plurality of unit regions arrayed in the column direction, the plurality of unit regions individually corresponding to the n number of stages included in the shift register, the n number of stages being configured to be supplied with the n number of types of clock signals having different phases from one another from the n number of clock main lines,
the plurality of branch wiring lines include at least one branch wiring line for each unit region, and
the plurality of unit regions include a first unit region and a second unit region, the first unit region being disposed closer to the terminal portion than the second unit region, a resistance value of the at least one branch wiring line between the inner main line and the outer main line in the first unit region being smaller than a resistance value of the at least one branch wiring line between the inner main line and the outer main line in the second unit region.

* * * * *